US012341099B2

(12) United States Patent
Xie et al.

(10) Patent No.: US 12,341,099 B2
(45) Date of Patent: Jun. 24, 2025

(54) SEMICONDUCTOR BACKSIDE TRANSISTOR INTEGRATION WITH BACKSIDE POWER DELIVERY NETWORK

(71) Applicant: International Business Machines Corporation, Armonk, NY (US)

(72) Inventors: Ruilong Xie, Niskayuna, NY (US); Daniel Charles Edelstein, White Plains, NY (US); Rajiv Joshi, Yorktown Heights, NY (US); Ravikumar Ramachandran, Pleasantville, NY (US); Eric Miller, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 474 days.

(21) Appl. No.: 17/934,913

(22) Filed: Sep. 23, 2022

(65) Prior Publication Data

US 2024/0105605 A1    Mar. 28, 2024

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/76898* (2013.01); *H01L 23/481* (2013.01);
(Continued)

(58) Field of Classification Search
CPC ............. H01L 23/5286; H01L 23/481; H01L 23/5226; H01L 21/76898; H10D 84/0149;
(Continued)

(56) References Cited

U.S. PATENT DOCUMENTS 3,962,052 A    6/1976 Abbas et al.
5,811,868 A    9/1998 Bertin et al.
(Continued)

FOREIGN PATENT DOCUMENTS

WO    2018118210 A1    6/2018

OTHER PUBLICATIONS

"Patent Cooperation Treaty PCT Notification of Transmittal of the International Search Report and the Written Opinion of the International Searching Authority, or the Declaration", Applicant's file reference P202105971, International application No. PCT/IB2023/058033, International filing date Aug. 9, 2023, date of mailing Nov. 8, 2023, 14 pages.

*Primary Examiner* — Joseph C. Nicely
(74) *Attorney, Agent, or Firm* — Jared C. Chaney

(57) ABSTRACT

A semiconductor structure includes a front-end-of-line level including a plurality of field effect transistors electrically connected to a back-end-of-line interconnect level. The back-end-of-line interconnect level is located on a first side of the front-end-of-line level. A backside power rail is embedded within a backside interlayer dielectric located on a second side of the front-end-of-line level opposing the first side of the front-end-of-line level. The backside power rail is electrically connected to at least one field effect transistor of the plurality of field effect transistors. At least one backside field effect transistor is formed on a first semiconductor layer disposed, at least in part, above a passive device region. A first side of the passive device region is in contact with the first semiconductor layer and a second side of the passive device region, opposing the first side, is in contact with the back-end-of-line interconnect level.

20 Claims, 26 Drawing Sheets

Section X

Section Y1

(51) Int. Cl.
　　　*H01L 23/48* (2006.01)
　　　*H01L 23/522* (2006.01)
　　　*H10D 84/01* (2025.01)
　　　*H10D 88/00* (2025.01)
　　　*H10D 30/01* (2025.01)
　　　*H10D 30/67* (2025.01)
　　　*H10D 84/80* (2025.01)

(52) U.S. Cl.
　　　CPC ..... *H01L 23/5226* (2013.01); *H10D 84/0149* (2025.01); *H10D 88/101* (2025.01); *H10D 30/014* (2025.01); *H10D 30/6735* (2025.01); *H10D 84/811* (2025.01)

(58) Field of Classification Search
　　　CPC .. H10D 84/811; H10D 88/101; H10D 30/014; H10D 30/6735
　　　See application file for complete search history.

(56) References Cited

U.S. PATENT DOCUMENTS

| | | | |
|---|---|---|---|
| 5,814,889 | A | 9/1998 | Gaul |
| 6,198,168 | B1 | 3/2001 | Geusic et al. |
| 7,935,571 | B2 | 5/2011 | Ramiah et al. |
| 8,759,947 | B2 * | 6/2014 | Tan ............ H10D 1/692 257/532 |
| 9,666,491 | B1 * | 5/2017 | Zhou ............ H10D 86/423 |
| 10,002,836 | B2 | 6/2018 | Spitzlsperger |
| 10,276,476 | B1 * | 4/2019 | Li ............ H10D 30/6755 |
| 10,586,765 | B2 | 3/2020 | Smith et al. |
| 10,636,739 | B2 | 4/2020 | Beyne |
| 10,797,139 | B2 | 10/2020 | Morrow et al. |
| 10,833,089 | B2 | 11/2020 | Pille et al. |
| 10,872,820 | B2 | 12/2020 | Block |
| 10,903,165 | B2 | 1/2021 | Rubin |
| 10,985,064 | B2 | 4/2021 | Zhang et al. |
| 11,239,208 | B2 | 2/2022 | Chuang |
| 11,257,764 | B2 | 2/2022 | Hiblot |
| 11,257,929 | B2 | 2/2022 | Morrow |
| 11,270,977 | B2 | 3/2022 | Jain |
| 2009/0108403 | A1 | 4/2009 | Gogoi |
| 2014/0264523 | A1 | 9/2014 | Loechelt et al. |
| 2016/0095221 | A1 | 3/2016 | Ramachandran et al. |
| 2018/0145030 | A1 | 5/2018 | Beyne et al. |
| 2018/0218973 | A1 | 8/2018 | Nelson |
| 2019/0016488 | A1 | 1/2019 | Peccetti |
| 2019/0164882 | A1 | 5/2019 | Chen et al. |
| 2020/0105671 | A1 | 4/2020 | Lai et al. |
| 2020/0266169 | A1 | 8/2020 | Kang et al. |
| 2020/0373242 | A1 | 11/2020 | Hiblot et al. |
| 2021/0104435 | A1 | 4/2021 | Son |
| 2021/0111115 | A1 | 4/2021 | Morrow |
| 2021/0118798 | A1 | 4/2021 | Liebmann et al. |
| 2021/0134721 | A1 | 5/2021 | Chiang et al. |
| 2021/0202385 | A1 | 7/2021 | Huang et al. |
| 2021/0202472 | A1 | 7/2021 | Thomson |
| 2021/0376155 | A1 | 12/2021 | Chang |
| 2022/0139911 | A1 | 5/2022 | Wei |
| 2022/0293513 | A1 * | 9/2022 | Li ............ H02J 50/05 |

\* cited by examiner

Section Y1

Section Y1

Section Y1

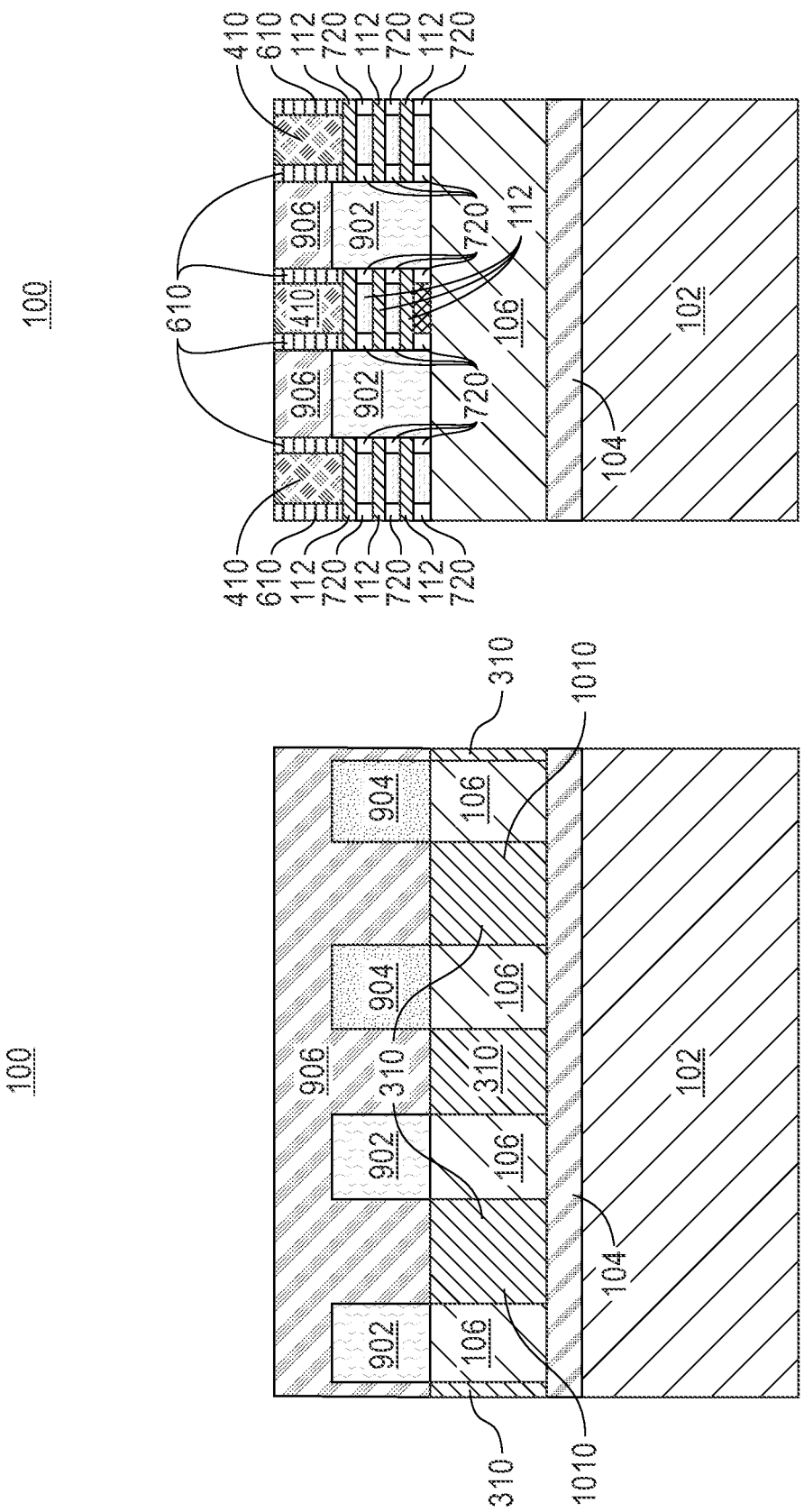

Section X

Section Y2

Section X

Section Y2

Section X

Section Y2

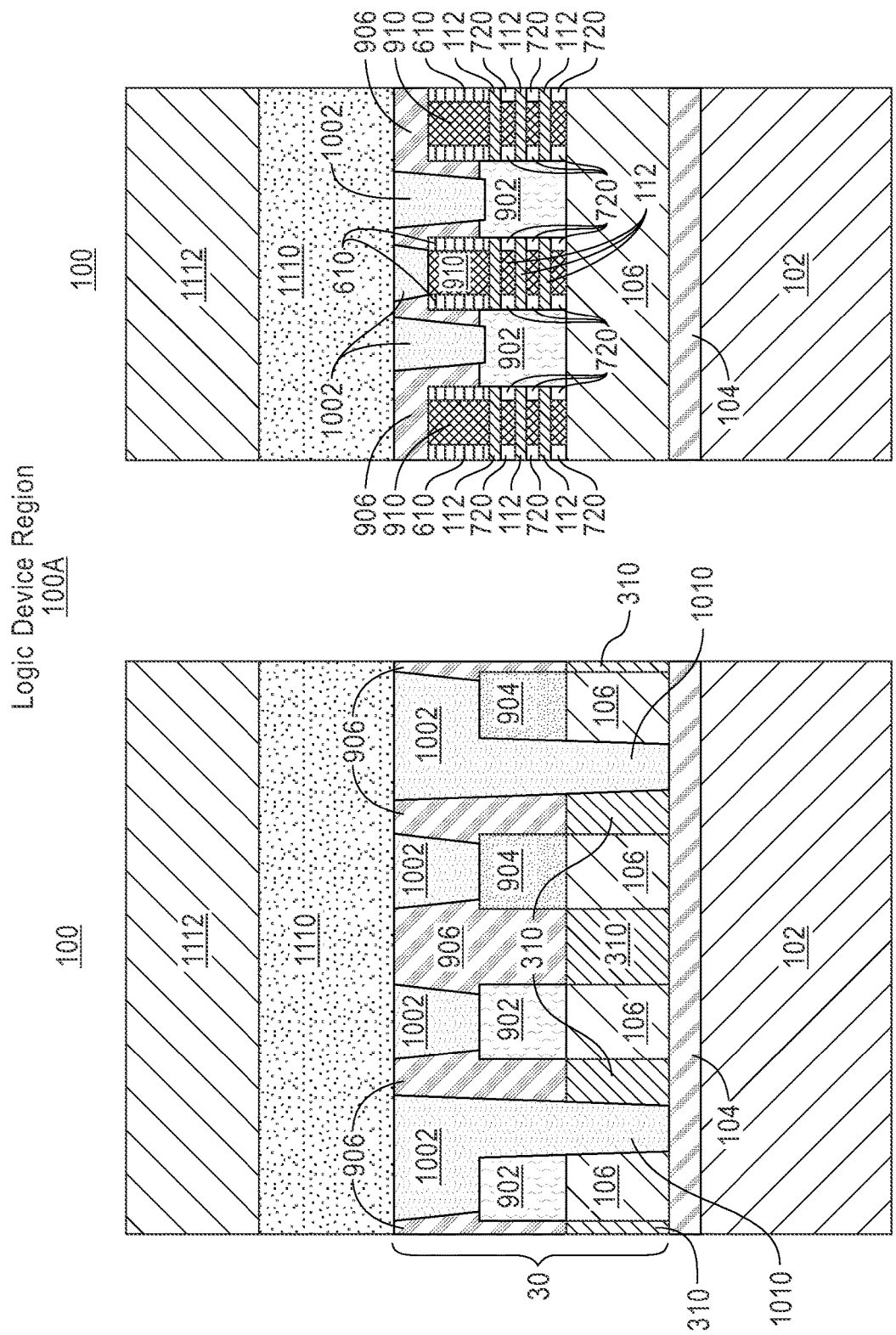

Section Y1

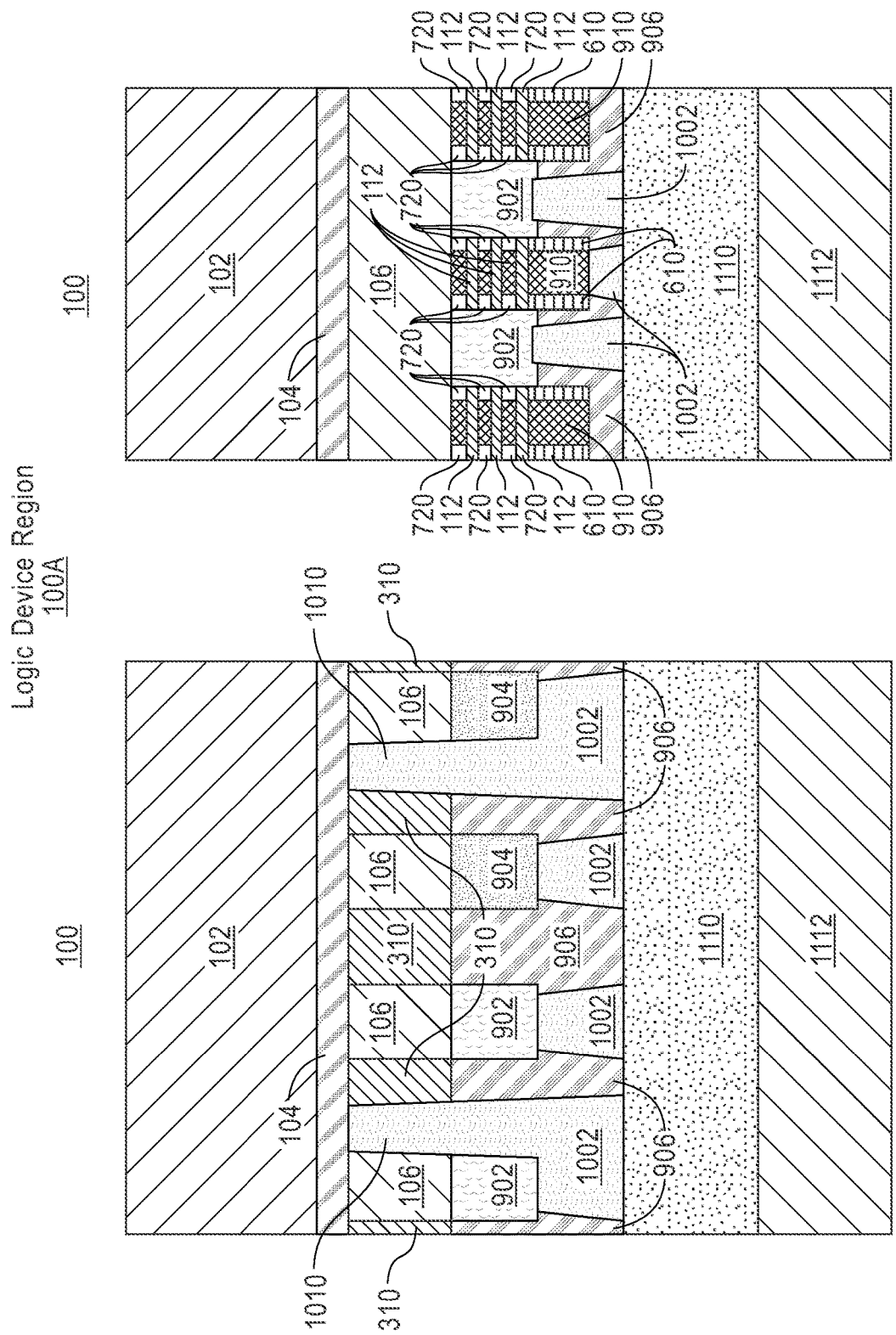

Section Y1

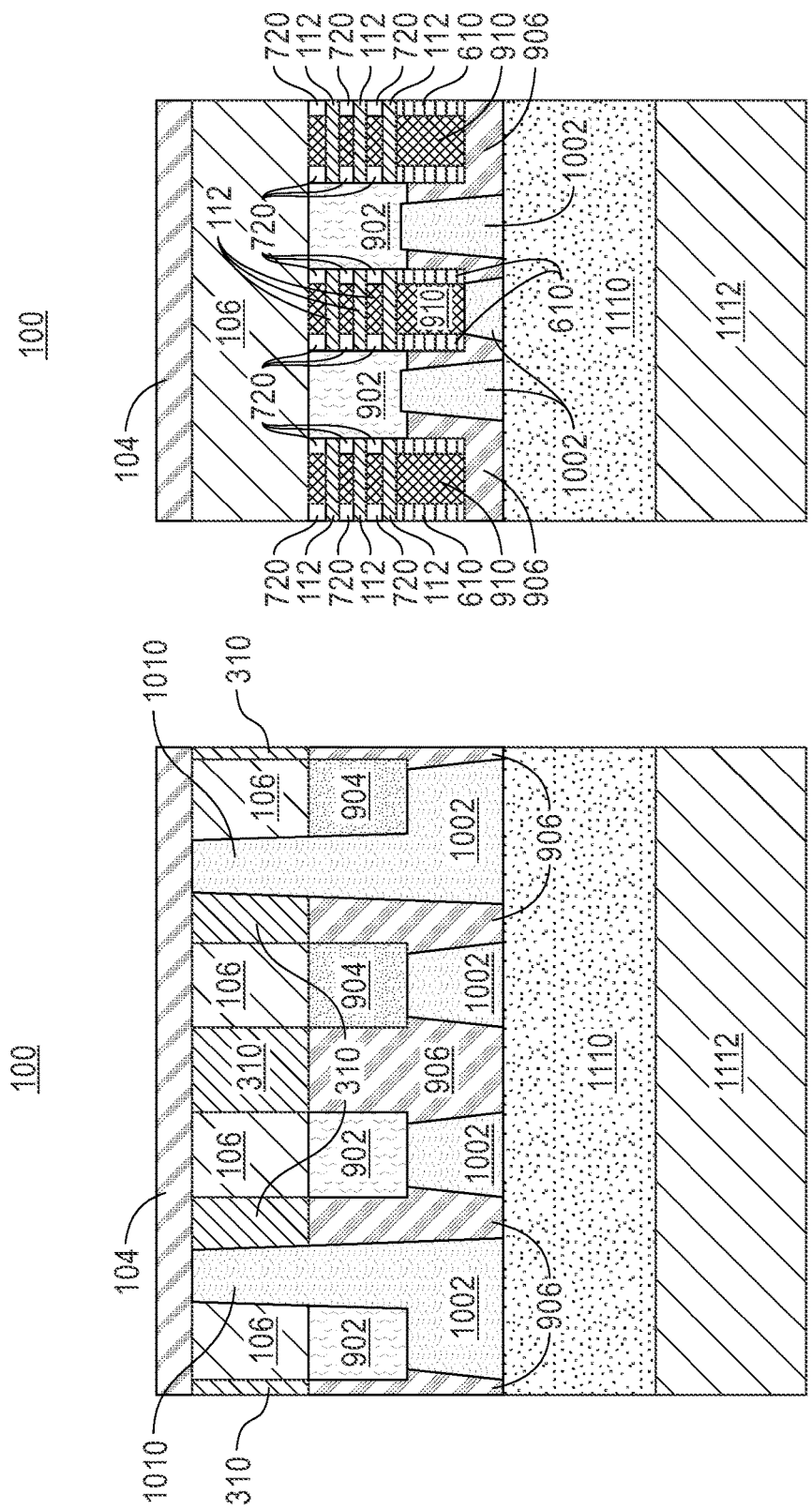

Section Y1

Section Y2

Section X

Section Y1

Section Y2

Section X

Section Y1

Section X

Section Y2

Section Y1

Section Y2

Section X

Section Y1

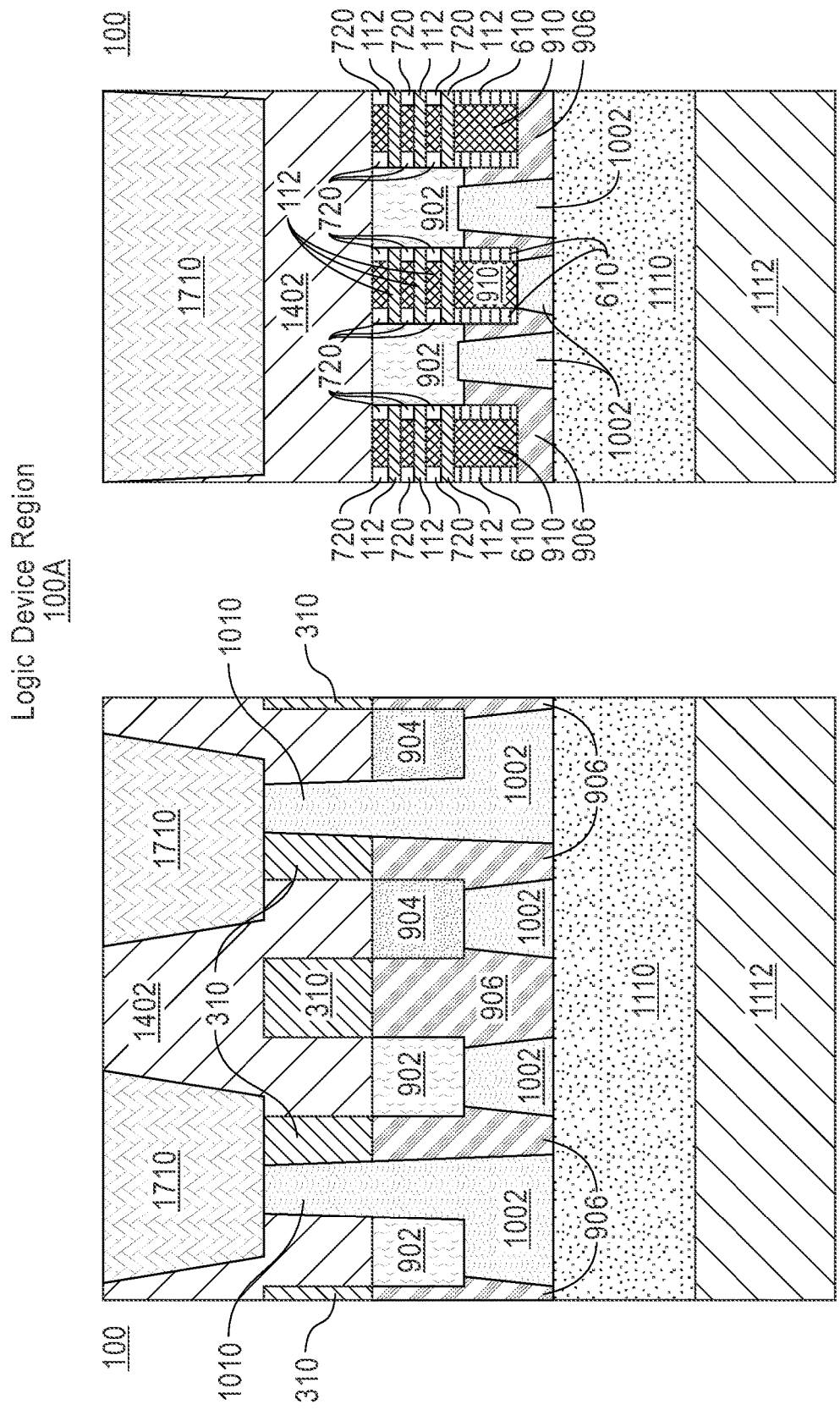

Section Y1

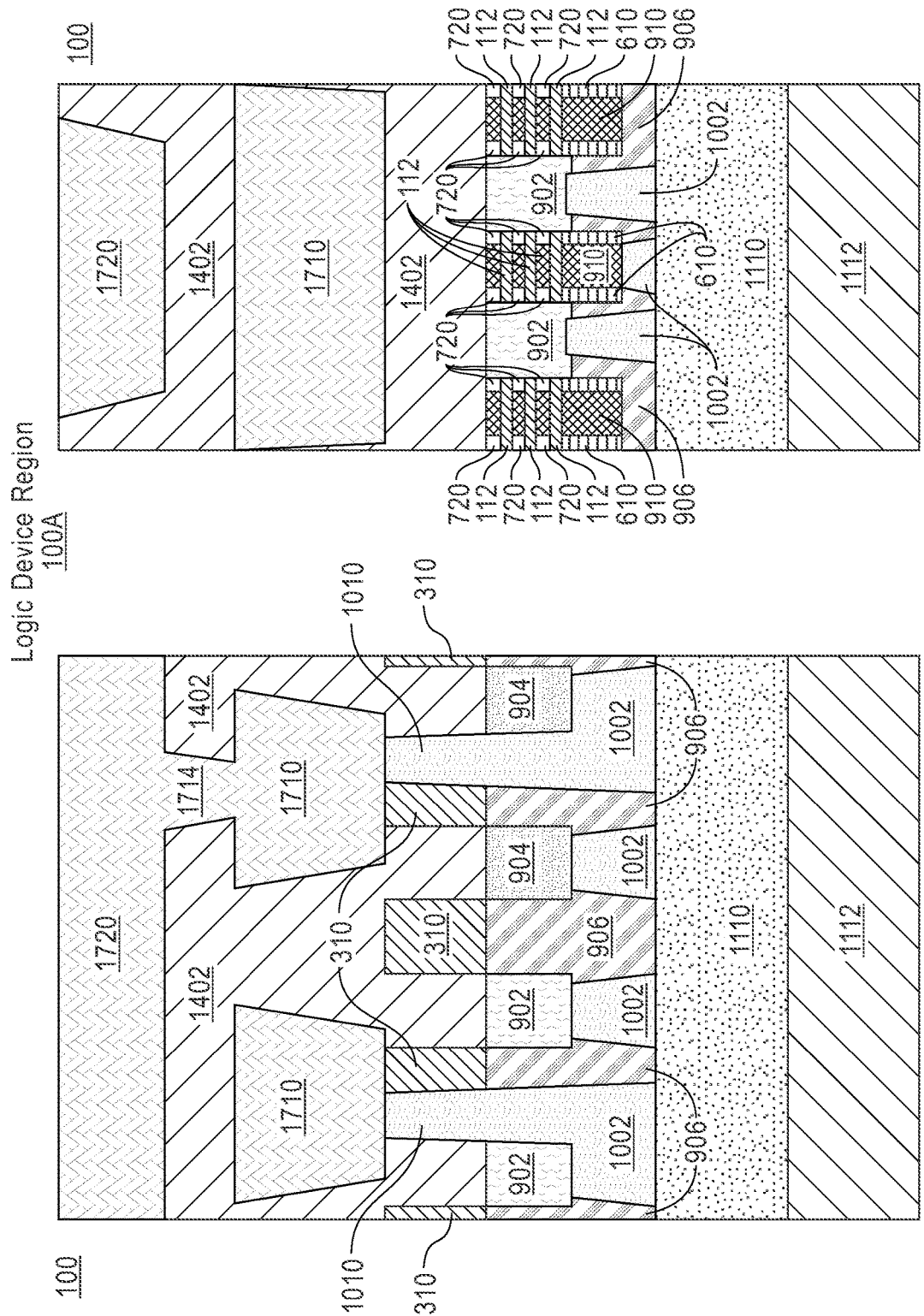
FIG. 16A Section Y2
FIG. 16B Section X

Section Y1

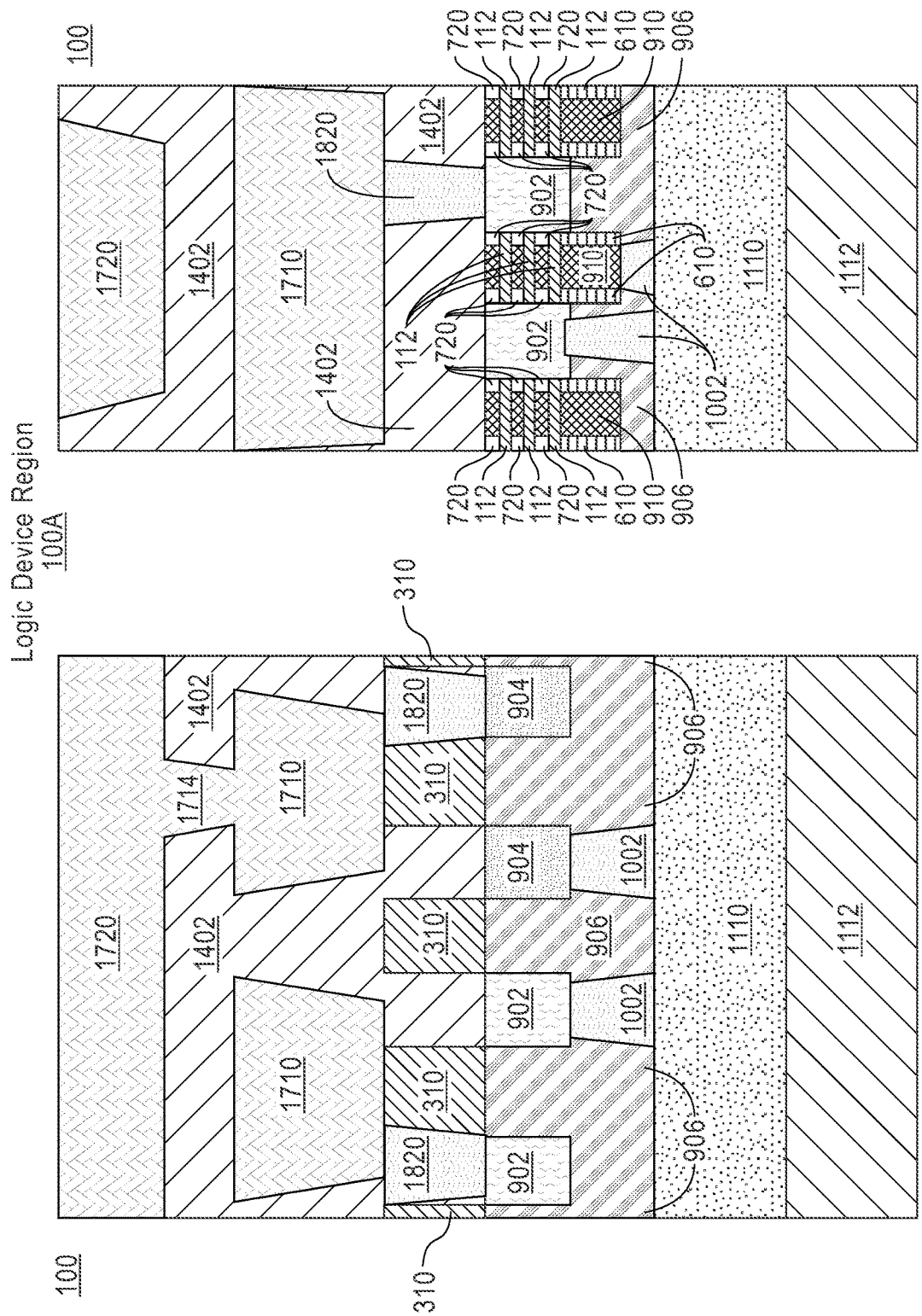
FIG. 17A Section Y2
FIG. 17B Section X

Section Y1

SEMICONDUCTOR BACKSIDE TRANSISTOR INTEGRATION WITH BACKSIDE POWER DELIVERY NETWORK

BACKGROUND

The present invention generally relates to the field of semiconductor devices, and more particularly to power delivery to active devices.

Modern integrated circuits (IC) are made up of transistors, capacitors, and other devices that are formed on semiconductor substrates. On a substrate, these devices are initially isolated from one another but are later interconnected together to form functional circuits. Typical interconnect structures include lateral interconnections, such as metal lines (wirings), and vertical interconnects, such as vias and contacts. Power is provided to the integrated circuits through power rails, which are in the metal layers of integrated circuits. For example, the bottom metal layer ($M_0$ or $M_1$) may include a plurality of metal lines such as VDD power rails and VSS power rails.

As ICs continue to scale downward in size, backside power rails (BPRs), i.e., power rails that are formed in the backside of the wafer, usually under the transistor "fins", and backside power delivery ("backside" is below the transistor substrate) have been proposed to alleviate design challenges and enable technology scaling beyond the 5 nm technology node. The BPR technology can free up resources for dense logic connections that limit modern processor performance, enable further scaling of a standard logic cell by removing the overhead in the area occupied by the power rails, and allow thicker low-resistance power rails that enable lower voltage (IR) drops. Although existing approaches in semiconductor fabrication have been generally adequate for their intended purposes, they have not been entirely satisfactory in all respects. One particular area of interest includes integrating backside transistors and backside power delivery network (BSPDN).

SUMMARY

According to an embodiment of the present disclosure, a semiconductor structure includes a front-end-of-line level including a plurality of field effect transistors electrically connected to a back-end-of-line interconnect level, the back-end-of-line interconnect level being located on a first side of the front-end-of-line level, a backside power rail embedded within a backside interlayer dielectric located on a second side of the front-end-of-line level opposing the first side of the front-end-of-line level, the backside power rail being electrically connected to at least one field effect transistor of the plurality of field effect transistors, and at least one backside field effect transistor on a first semiconductor layer disposed, at least in part, above a passive device region, a first side of the passive device region being in contact with the first semiconductor layer and a second side of the passive device region, opposing the first side, being in contact with the back-end-of-line interconnect level.

According to another embodiment of the present disclosure, a method of forming a semiconductor structure includes forming a front-end-of-line level including a plurality of field effect transistors electrically connected to a back-end-of-line interconnect level, the back-end-of-line interconnect level being located on a first side of the front-end-of-line level, forming a backside power rail embedded within a backside interlayer dielectric located on a second side of the front-end-of-line level opposing the first side of the front-end-of-line level, the backside power rail being electrically connected to at least one field effect transistor of the plurality of field effect transistors, and forming at least one backside field effect transistor on a first semiconductor layer disposed, at least in part, above a passive device region, a first side of the passive device region being in contact with the first semiconductor layer and a second side of the passive device region, opposing the first side, being in contact with the back-end-of-line interconnect level.

BRIEF DESCRIPTION OF THE DRAWINGS

The following detailed description, given by way of example and not intended to limit the invention solely thereto, will best be appreciated in conjunction with the accompanying drawings, in which:

FIG. 5A is a cross-sectional view of the semiconductor structure taken along Y2-Y2, as depicted in FIG. 1, after completing front-end-of-line processing steps, according to an embodiment of the present disclosure;

FIG. 5B is a cross-sectional view of the semiconductor structure taken along X-X, as depicted in FIG. 1, according to an embodiment of the present disclosure;

FIG. 8A is a cross-sectional view of the semiconductor structure taken along Y2-Y2, as depicted in FIG. 1, after forming a back-end-of-line interconnect level and a carrier wafer, according to an embodiment of the present disclosure;

FIG. 8B is a cross-sectional view of the semiconductor structure taken along X-X, as depicted in FIG. 1, according to an embodiment of the present disclosure;

FIG. 9A is a cross-sectional view of the semiconductor structure taken along Y2-Y2, as depicted in FIG. 1, after wafer flipping, according to an embodiment of the present disclosure;

FIG. 9B is a cross-sectional view of the semiconductor structure taken along X-X, as depicted in FIG. 1, according to an embodiment of the present disclosure;

FIG. 10A is a cross-sectional view of the semiconductor structure taken along Y2-Y2, as depicted in FIG. 1, after substrate removal, according to an embodiment of the present disclosure;

FIG. 10B is a cross-sectional view of the semiconductor structure taken along X-X, as depicted in FIG. 1, according to an embodiment of the present disclosure;

FIG. 15A is a cross-sectional view of the semiconductor structure taken along Y2-Y2, as depicted in FIG. 1, after forming backside power rails and backside metal contacts, according to an embodiment of the present disclosure;

FIG. 15B is a cross-sectional view of the semiconductor structure taken along X-X, as depicted in FIG. 1, according to an embodiment of the present disclosure;

FIG. 16A is a cross-sectional view of the semiconductor structure taken along Y2-Y2, as depicted in FIG. 1, after forming a backside power delivery network and backside interconnects, according to an embodiment of the present disclosure;

FIG. 16B is a cross-sectional view of the semiconductor structure taken along X-X, as depicted in FIG. 1, according to an embodiment of the present disclosure;

FIG. 17A is a cross-sectional view of the semiconductor structure taken along Y2-Y2, as depicted in FIG. 1, after forming a backside power delivery network and backside interconnects, according to an alternate embodiment of the present disclosure;

FIG. 17B is a cross-sectional view of the semiconductor structure taken along X-X, as depicted in FIG. 1, according to an alternate embodiment of the present disclosure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
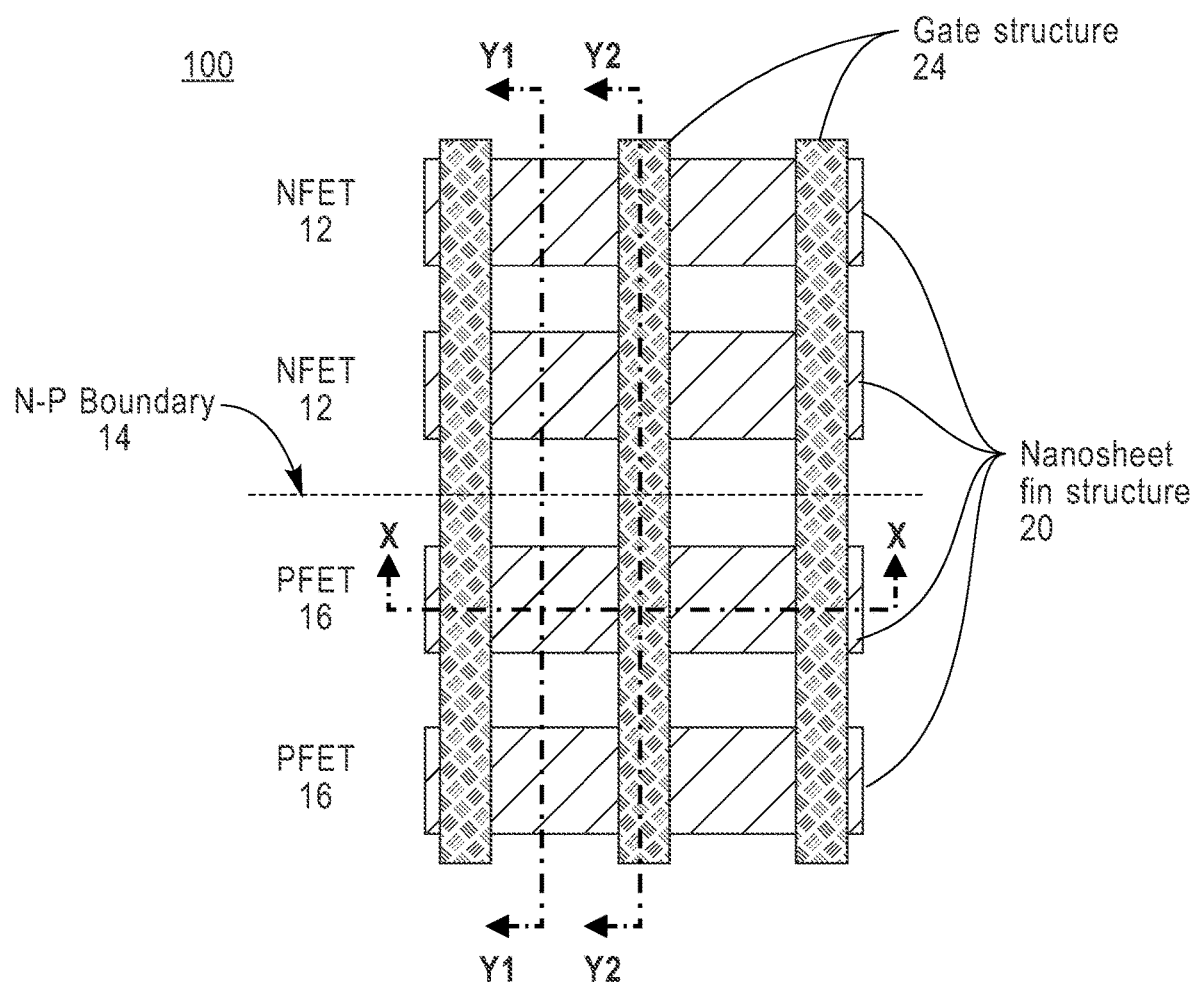
FIG. 1 is a top-down view of a semiconductor structure at an intermediate step during a semiconductor manufacturing process depicting different cross-sectional views used to describe embodiments of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

In current semiconductor manufacturing technology, both backside transistors and backside power connections are formed over silicon (Si). This can negatively impact device scaling for logic devices due to the need for additional dielectric spacers to form TSVs effectively isolated from the Si layer, in addition to forming interconnects for backside power distribution having a larger size and pitch.

Therefore, embodiments of the present disclosure provide a semiconductor structure, and a method of making the same, in which formation of backside transistors and a backside power delivery network (BPDN) is integrated for improved device scaling. The backside transistors and backside power rails are formed by backside processes which are performed after completing BEOL processes and flipping the wafer over. In the proposed embodiments, a remaining silicon layer located on a passive device region of the backside of the wafer allows the formation of the backside transistors at substantially the same level of the backside power rails. According to the proposed embodiments, only dielectric materials are present under the logic device region (i.e., no Si remaining), which enables forming via-to-backside power rails (VBPR) with very small CD and in contact with active regions for improved logic scaling. More particularly, the proposed semiconductor structure includes, among other elements or features, at least a via-to-backside power rail contact electrically connecting FEOL devices to backside power rails and at least one backside transistor formed over a single-crystal silicon layer located on a passive device region. Although, direct backside contact to source/drain epi regions (i.e., no VBPRs) is also contemplated within the scope of the present invention.

An embodiment by which the semiconductor structure having a backside transistor integrated with BSPDN can be formed is described in detailed below by referring to the accompanying drawings in FIGS. 1-16C.

Referring now to FIG. 1, a top-down view of a semiconductor structure 100 is shown at an intermediate step during a semiconductor manufacturing process, according to an embodiment of the present disclosure. Particularly, FIG. 1 depicts different cross-sectional views of the semiconductor structure 100 that will be used to describe embodiments of the present disclosure. The cross-sectional views are taken along line X-X, line Y1-Y1 and line Y2-Y2. As depicted in the figure, line X-X represents a cut along a nanosheet fin structure or nanosheet fin region 20 of the semiconductor structure 100, line Y1-Y1 represents a cut across source/drain regions in NFET regions 12 and PFET regions 16 of the semiconductor structure 100, and line Y2-Y2 represents a cut along a gate structure or gate region 24 of the semiconductor structure 100.

In this embodiment, the cross-sectional view taken along line Y1-Y1 further includes a view of NFET regions 12 and/or PFET regions 16 and an area (N-P boundary) 14 between NFET and PFET regions 12, 16.

Figure 2:
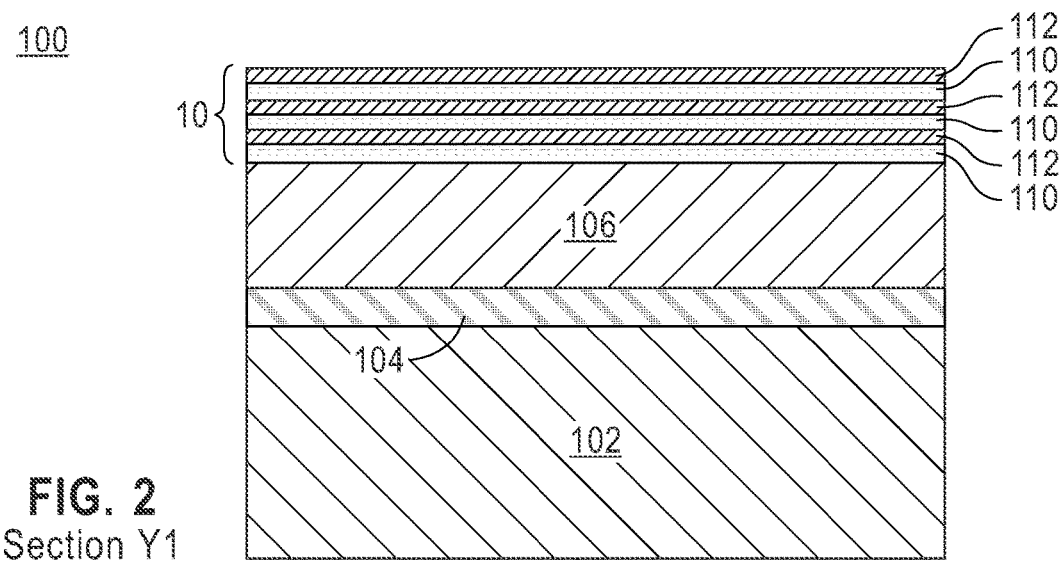
FIG. 2 is a cross-sectional view of the semiconductor structure taken along Y1-Y1, as depicted in FIG. 1, after forming a nanosheet stack, according to an embodiment of the present disclosure.

Referring now to FIG. 2, a cross-sectional view of the semiconductor structure 100 is shown after forming a nanosheet stack 10, according to an embodiment of the present disclosure. In this embodiment, FIG. 2 is a cross-sectional view of the semiconductor structure 100 taken along Y1-Y1 as depicted in FIG. 1.

In the depicted example, the semiconductor structure 100 includes a substrate 102, a first sacrificial layer 104 located above the substrate 102, and a first semiconductor layer 106 disposed above the first sacrificial layer 104. According to an embodiment, the first sacrificial layer 104 and the first semiconductor layer 106 are vertically stacked one on top of another in a direction perpendicular to the substrate 102, as illustrated in the figure.

The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium phosphide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

With continued reference to FIG. 2, according to an embodiment, the first sacrificial layer 104, can be formed on the substrate 102 using an epitaxial growth process. For instance, in the described embodiment, the first sacrificial layer 104 is formed by epitaxially growing a layer of SiGe with a germanium concentration varying from approximately 15 atomic percent to approximately 35 atomic percent. In some embodiments, the first sacrificial layer 104 can be made of epitaxially grown SiGe with a germanium concentration of approximately 30 atomic percent. In one or more embodiments, the first sacrificial layer 104 may act as an etch stop layer during subsequent substrate removal. Similarly, the first semiconductor layer 106 is formed by epitaxially growing a Si layer to a thickness varying from approximately 30 nm to approximately 250 nm, although other thicknesses are within the contemplated scope of the invention. In some embodiments, the first sacrificial layer 104 may include $SiO_2$. In such embodiments, the combined structure formed by the substrate 102, the first sacrificial layer 104, and the first semiconductor layer 106 can be an SOI wafer, with the first sacrificial layer 104 being the buried oxide (BOX) including a thickness ranging from approximately 20 nm to approximately 100 nm, and ranges therebetween.

In general, the first sacrificial layer 104 and the first semiconductor layer 106 can be formed by epitaxial growth by using the substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the first sacrificial layer 104 and the first semiconductor layer 106. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

In the depicted embodiment, an alternating sequence of layers of sacrificial semiconductor material and layers of semiconductor channel material vertically stacked one on top of another in a direction perpendicular to the substrate 102 forms the nanosheet stack 10, as illustrated in the figure. Specifically, the alternating sequence includes a first sacrificial semiconductor layer 110 and a semiconductor channel layer 112 above the first sacrificial semiconductor layer 110. In the example depicted in the figure, alternating first sacrificial semiconductor layers 110 and semiconductor channel layers 112 are formed in a (nanosheet) stack 10 above the first semiconductor layer 106. The term sacrificial, as used herein, means a layer or other structure, that is (or a part thereof is) removed before completion of the final device.

For instance, in the example being described, portions of the first sacrificial semiconductor layers 110 will be removed from the stack in the channel region of the device to permit the semiconductor channel layers 112 to be released from the nanosheet stack 10. It is notable that while in the present example the first sacrificial semiconductor layers 110 and the semiconductor channel layers 112 are made of silicon germanium (SiGe) and silicon (Si), respectively, any combination of sacrificial and channel materials may be employed in accordance with the present techniques. For example, one might instead employ selective etching technology which permits Si to be used as the sacrificial material between SiGe channel layers.

In general, layers in the nanosheet stack 10 (e.g., SiGe and Si layers) can be formed by epitaxial growth by using the first semiconductor layer 106 as the seed layer. For instance, the first sacrificial semiconductor layers 110 are formed by epitaxially growing a layer of SiGe. In this embodiment, the germanium concentration of the first sacrificial semiconductor layers 110 may vary from approximately 15 atomic percent to approximately 35 atomic percent. In a preferred embodiment, each of the first sacrificial semiconductor layers 110 includes a layer of SiGe with a germanium concentration of approximately 30 atomic percent.

To continue building the nanosheet stack 10, the semiconductor channel layers 112 are formed by epitaxially growing a Si layer. As depicted in the figure, the first sacrificial semiconductor layers 110 and the semiconductor channel layers 112 have a substantially similar or identical thickness. The nanosheet stack 10 is grown by forming (SiGe) sacrificial semiconductor layers 110 and (Si) semiconductor channel layers 112 in an alternating manner onto the first semiconductor layer 106. Accordingly, each of the first sacrificial semiconductor layers 110 and the semiconductor channel layers 112 in the nanosheet stack 10 can be formed in the same manner as described above, e.g., using an epitaxial growth process, to a thickness varying from approximately 6 nm to approximately 12 nm, although other thicknesses are within the contemplated scope of the invention.

Thus, each of the layers in the nanosheet stack 10 have nanoscale dimensions, and thus can also be referred to as nanosheets. Further, as highlighted above, the (Si) semiconductor channel layers 112 in the nanosheet stack 10 will be used to form the channel layers of the device. Consequently, the dimensions of the semiconductor channel layers 112 dictate the dimensions of the channel region of the semiconductor structure 100.

As highlighted above, the goal is to produce a stack of alternating (sacrificial and channel) SiGe and Si layers on the wafer. The number of layers in the stack can be tailored depending on the particular application. Thus, the configurations depicted and described herein are merely examples meant to illustrate the present techniques. For instance, the present nanosheet stack 10 can contain more or fewer layers than are shown in the figures.

The nanosheet stack 10 can be used to produce a gate all around device that includes vertically stacked semiconductor channel material nanosheets for a positive channel Field Effect Transistor (hereinafter "PFET") or a negative channel Field Effect Transistor (hereinafter "NFET") device.

Figure 3:
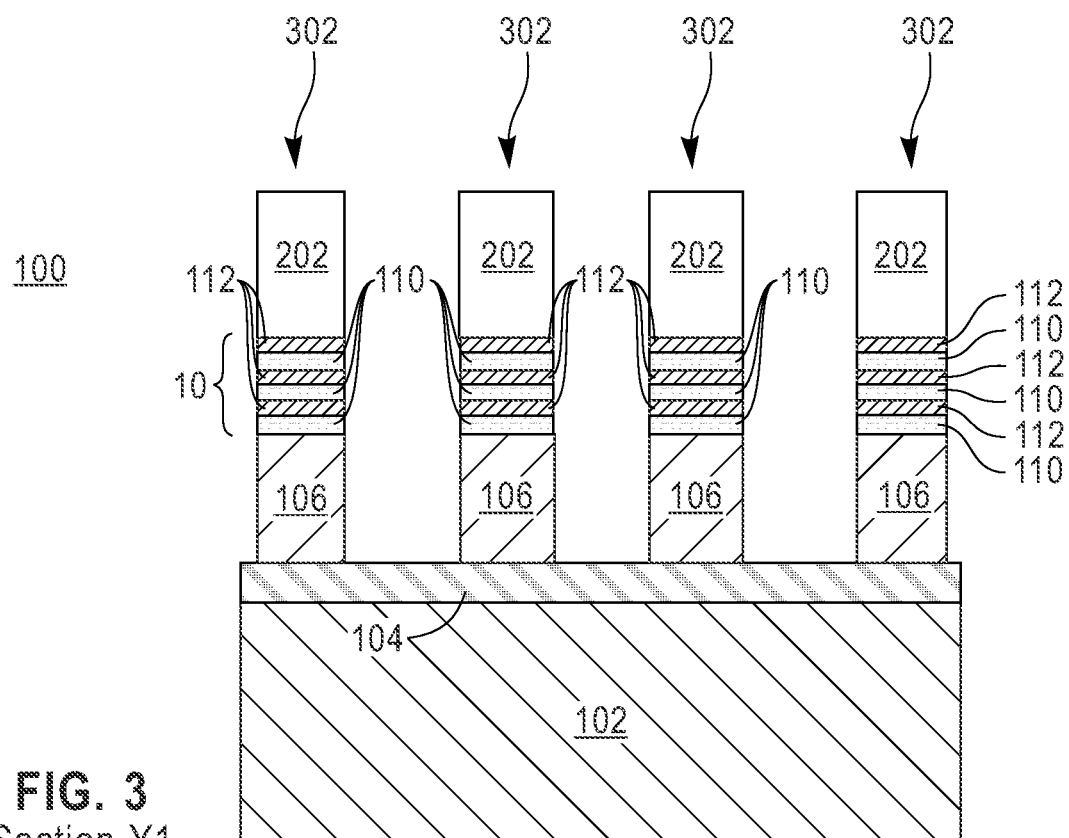
FIG. 3 is a cross-sectional view of the semiconductor structure taken along Y1-Y1, as depicted in FIG. 1, after forming a hardmask layer and patterning the nanosheet stack to form a plurality of nanosheet fins, according to an embodiment of the present disclosure.
Figure 4:
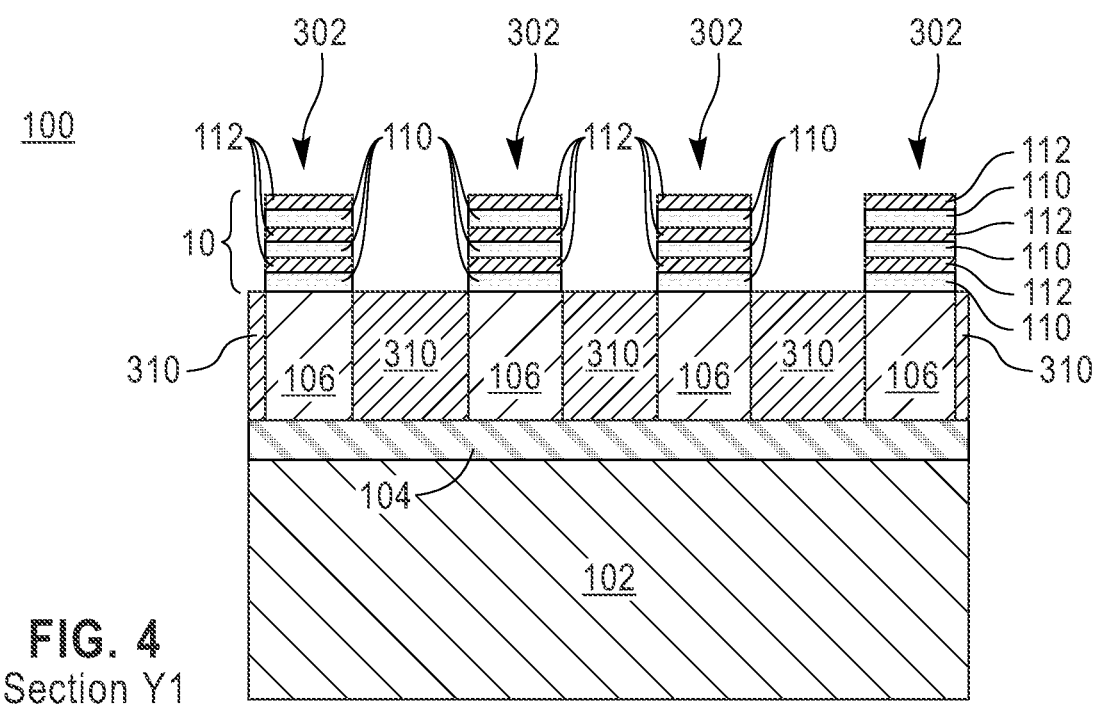
FIG. 4 is a cross-sectional view of the semiconductor structure taken along Y1-Y1, as depicted in FIG. 1, after forming shallow trench isolation regions and removing the hardmask layer, according to an embodiment of the present disclosure.

Referring now to FIG. 3 and FIG. 4 simultaneously, cross-sectional views of the semiconductor structure 100 are shown after forming a hardmask layer 202, patterning the nanosheet stack 10 to form a plurality of nanosheet fins (hereinafter "nanosheet fins") 302, and forming shallow trench isolation (STI) regions 310, according to embodiments of the present disclosure. In these embodiments, FIG. 3 and FIG. 4 are cross-sectional views of the semiconductor structure 100 taken along Y1-Y1 as depicted in FIG. 1.

In this embodiment, a hardmask layer 202 can be formed over the nanosheet stack 10 by depositing a hard mask material (e.g., silicon nitride) using, for example, chemical vapor deposition (CVD), plasma enhanced CVD (PECVD) or any suitable technique for dielectric deposition. By way of example only, the hardmask layer 202 may be formed having a thickness varying from approximately 20 nm to approximately 200 nm, although thicknesses greater than 200 nm and less than 20 nm may also be used.

After depositing the hardmask layer 202, a photolithographic patterning is then conducted on the deposited hardmask layer 202 to form a plurality of individual fin hardmasks. According to an exemplary embodiment, reactive ion etching (RIE) can be used to etch through the nanosheet stack 10 to form nanosheet fins 302. The etching process may continue until portions of the first semiconductor layer 106 located between adjacent nanosheet fins 302 are removed forming a plurality of trenches (not shown) that can expose the first sacrificial layer 104. The plurality of trenches (not shown) formed during the photolithographic patterning process are subsequently filled with an insulating material to form shallow trench isolation (STI) regions 310, as depicted in FIG. 4.

The process of forming the STI regions 310 is standard and well-known in the art, it typically involves depositing the insulating material to substantially fill the plurality of trenches (not shown) created after removing the portions of the first semiconductor layer 106 located between adjacent nanosheet fins 302. According to an embodiment, the STI regions 310 electrically isolate the nanosheet fins 302. The STI regions 310 may be formed by, for example, CVD of a dielectric material. Non-limiting examples of dielectric materials to form the STI regions 310 include silicon oxide, silicon nitride, hydrogenated silicon carbon oxide, silicon based low-k dielectrics, flowable oxides, porous dielectrics, or organic dielectrics including porous organic dielectrics. After forming the STI regions 310, the hardmask layer 202 can be removed from the semiconductor structure 100 using any suitable etching technique.

Figure 6B:
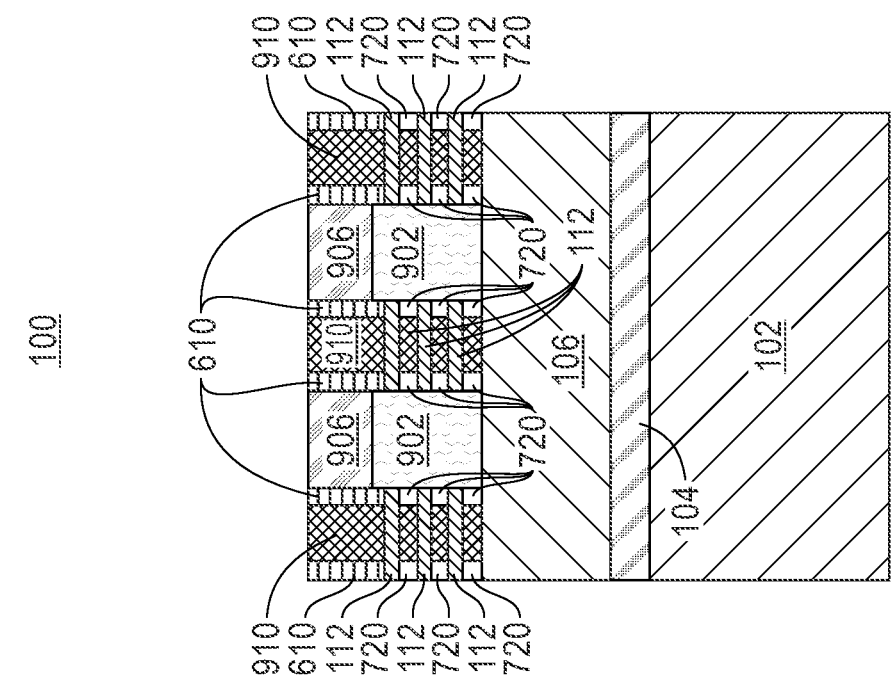
FIG. 6B is a cross-sectional view of the semiconductor structure taken along X-X, as depicted in FIG. 1, according to an embodiment of the present disclosure.
Figure 6A:
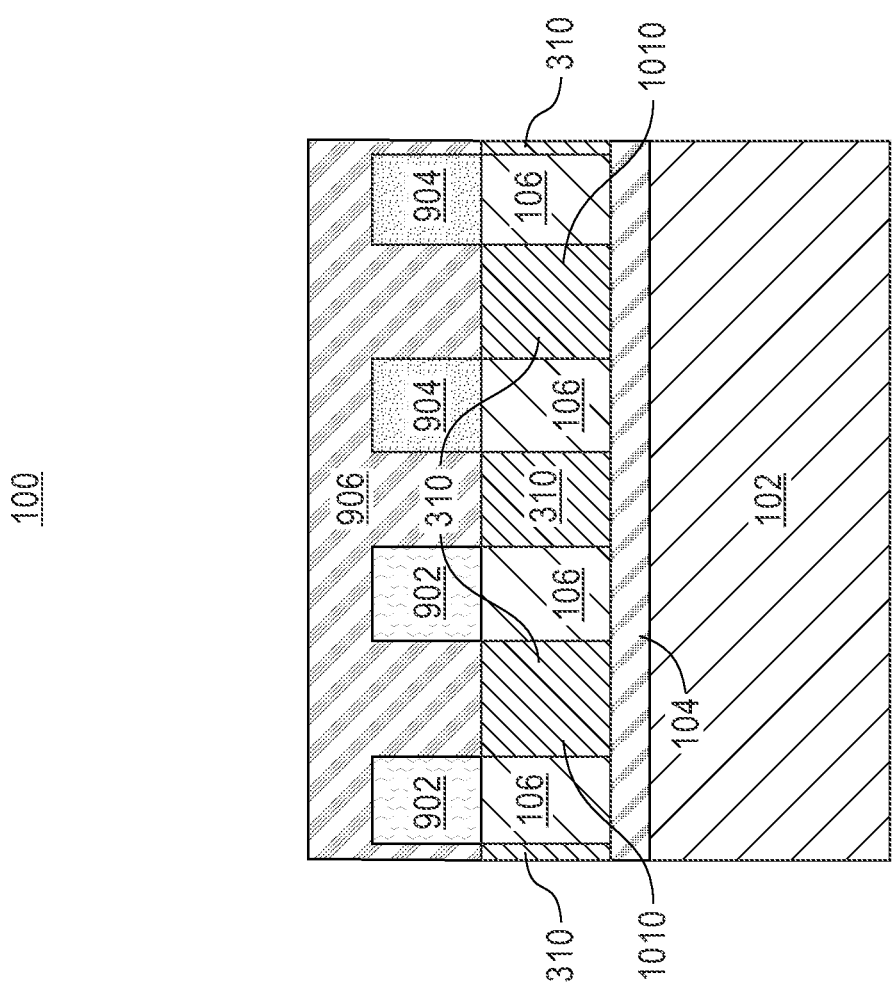
FIG. 6A is a cross-sectional view of the semiconductor structure taken along Y2-Y2, as depicted in FIG. 1, after a replacement metal gate process, according to an embodiment of the present disclosure.

Referring now to FIGS. 5A-5B and FIGS. 6A-6B simultaneously, cross-sectional views of the semiconductor structure 100 are shown after completing front-end-of-line (FEOL) processing steps, according to embodiments of the present disclosure. In these embodiments, FIG. 5A and FIG. 6A are cross-sectional views of the semiconductor structure 100 taken along line Y2-Y2 as depicted in FIG. 1, while FIG. 5B and FIG. 6B are cross-sectional views of the semiconductor structure 100 taken along line X-X as depicted in FIG. 1.

Known semiconductor fabrication operations have been used to form the semiconductor structure 100 as depicted in FIGS. 5A-5B and FIGS. 6A-6B. Thus, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Generally, at this step of the manufacturing process, a replacement gate 910, gate spacers 610, inner spacers 720, first source/drain regions 902, second source/drain regions 904, and an interlevel dielectric (ILD) layer 906 are formed in the semiconductor structure 100. This can be done by first forming a dummy gate 410, as depicted in FIG. 5B, using conventional deposition, lithography and etching processes, followed by formation of the gate spacers 610 and nanosheet stack recess in the source/drain region(s). Subsequently, an outer portion of each of the first sacrificial semiconductor layers 110 (FIG. 5B) may be removed using methods known in the art. Inner spacers 720 may be formed within cavities (not shown) of the first sacrificial semiconductor layers 110. As depicted in FIG. 5B, outer vertical sides of the inner spacers 720 may vertically align with the semiconductor channel layers 112. Inner spacers 720 can be formed, for example, by conformal deposition of an inner spacer material that pinches off the indented cavity (not shown) formed after recessing of the first sacrificial semiconductor layers 110 followed by an isotropic etching process. The inner spacers 720 may include any suitable dielectric material, such as silicon dioxide or silicon nitride, and may include a single layer or multiple layers of dielectric materials.

After forming the inner spacers 720, the first source/drain regions 902 can be formed within PFET regions of the semiconductor structure 100. Similarly, the second source/drain regions 904 can be formed within NFET regions of the semiconductor structure 100, as depicted in the figures. The first and second source/drain regions 902, 904 can be formed using an epitaxial layer growth process on the exposed ends of the semiconductor channel layers 112.

According to an embodiment, first and second source/drain regions 902, 904 can be formed on opposing sides of the nanosheet fins 302 in direct contact with end portions of the semiconductor channel layers 112 and end portions of the inner spacers 720. For example, FIG. 5B depicts first source/drain regions 902 formed on opposing sides of the nanosheet fins 302 located on an NFET region of the semiconductor structure 100. Typically, after forming the first and second source/drain regions 902, 904, the interlevel dielectric layer 906 can be formed to fill voids in the semiconductor structure 100. The interlevel dielectric layer 906 can be formed by, for example, CVD of a dielectric material. Non-limiting examples of dielectric materials to form the interlevel dielectric layer 906 may include silicon oxide, silicon nitride, hydrogenated silicon carbon oxide, silicon based low-k dielectrics, flowable oxides, porous dielectrics, or organic dielectrics including porous organic dielectrics.

As known by those skilled in the art, after deposition of the interlevel dielectric layer 906, a planarization process (e.g., CMP) can be conducted on the semiconductor structure 100. This process may expose a top surface of the dummy gate 410 in preparation for a replacement metal gate process. In a gate-last fabrication process, the removed dummy gate 410 is thereafter replaced with a high-k metal gate structure, i.e., the replacement gate 910 (shown in FIG. 6B) as known in the art. According to an embodiment, the first sacrificial semiconductor layers 110 (FIGS. 5A-5B) can now be removed from the semiconductor structure 100 using known etching processes including, for example, RIE, wet etch or dry gas (HCl). Removal of the sacrificial semiconductor layers 110 (FIGS. 5A-5B) create cavities (not shown) between the inner spacers 720 that will subsequently be filled with corresponding gate dielectric and work function metals to form the high-k metal gate structure or replacement gate 910, as depicted in FIG. 6B.

The replacement gate 910 includes gate dielectrics, such as hafnium oxide ($HfO_2$), zirconium dioxide ($ZrO_2$), hafnium-aluminum oxide (HfAlOx), hafnium-lanthanum oxide g (HfLaOx), etc., and one or more work function metals including, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). As can be appreciated in FIG. 9B, the replacement gate 910 surrounds (stacked) semiconductor channel layers 112. Additionally, in other embodiments, a gate cap (not shown) may be formed above the replacement gate 910.

After forming the replacement gate 910, a chemical mechanical polishing (CMP) may be conducted to remove excess material and polish upper surfaces of the semiconductor structure 100.

Figure 7B:
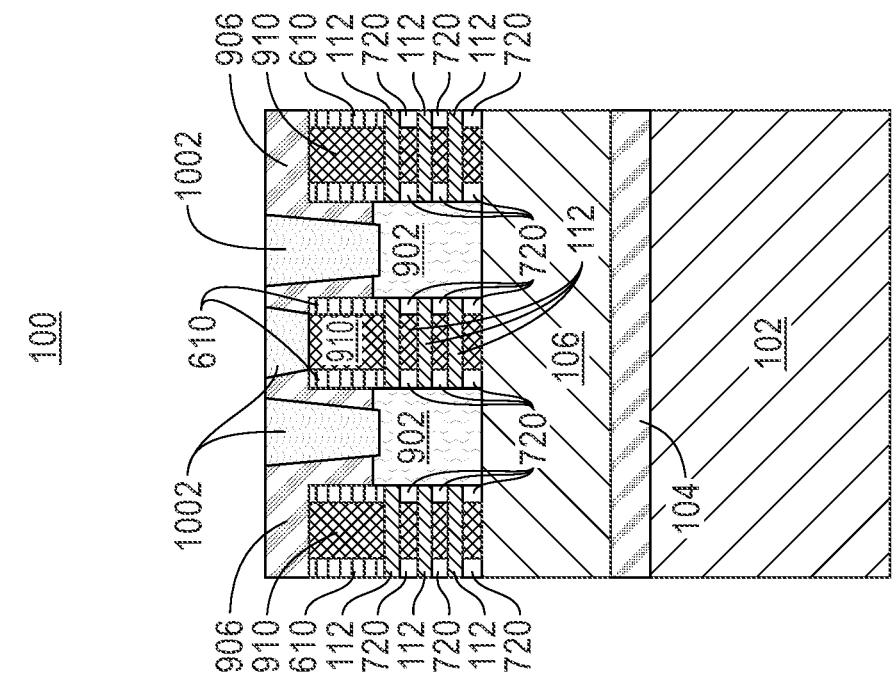
FIG. 7B is a cross-sectional view of the semiconductor structure taken along X-X, as depicted in FIG. 1, according to an embodiment of the present disclosure.
Figure 7A:
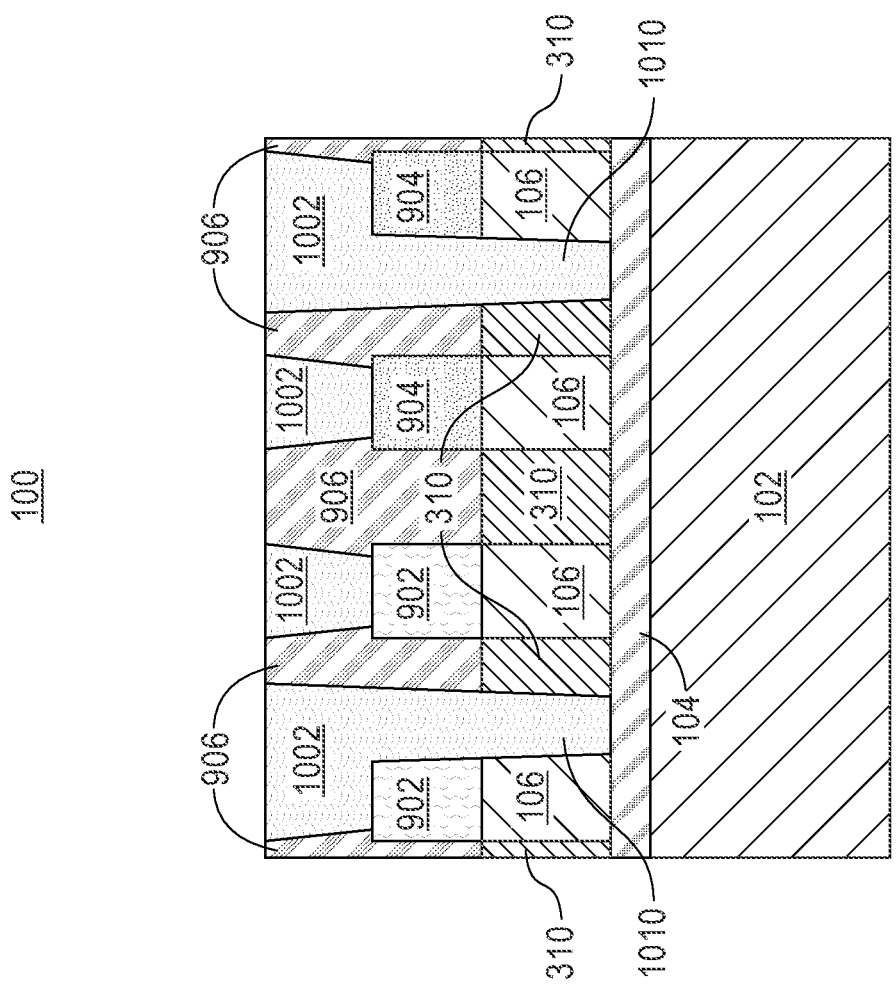
FIG. 7A is a cross-sectional view of the semiconductor structure taken along Y2-Y2, as depicted in FIG. 1, after middle-of-line contact patterning and metallization, according to an embodiment of the present disclosure.

Referring now to FIGS. 7A-7B, cross-sectional views of the semiconductor structure 100 are shown after middle-of-line (MOL) contact patterning and metallization, according to an embodiment of the present disclosure. In this embodiment, FIG. 7A is a cross-sectional view of the semiconductor structure 100 taken along line Y2-Y2 as depicted in FIG. 1, while FIG. 7B is a cross-sectional view of the semiconductor structure 100 taken along line X-X as depicted in FIG. 1.

As illustrated in the figure, a plurality of conductive structures including metal contacts 1002 are formed in the semiconductor structure 100 for electrically connecting FEOL devices to subsequently formed metal levels. The process of forming the metal contacts is standard and well-known in the art. Typically, the process includes forming trenches (not shown) within the interlevel dielectric layer 906 and subsequently filling the trenches with a conductive material or a combination of conductive materials to form the metal contacts 1002. In one or more embodiments, the conductive material filling the metal contacts 1002 may include a silicide liner (e.g., titanium (Ti), nickel (Ni), nickel-platinum (NiPt) alloy, etc.), a metal adhesion liner (e.g., titanium nitride (TiN)), and a conductive metal (e.g., aluminum (Al), tungsten (W), copper (Co), ruthenium (Ru), or any combination thereof).

The conductive material may be deposited by a suitable deposition process, for example, CVD, PECVD, PVD, plating, thermal or e-beam evaporation, or sputtering. A planarization process, for example, CMP, is performed to remove any conductive material from upper surfaces of the semiconductor structure 100. In the depicted example, metal contacts 1002 include source/drain contacts that extend until an uppermost surface of each of the first and second source/drain regions 902, 904 and gate contacts to the replacement gate 910.

In addition to the metal contacts 1002, a via-to-backside power rail (VBPR) 1010 can also be formed in the semiconductor structure 100. The VBPR 1010 may electrically connect the semiconductor structure 100 to a subsequently formed backside power rail (BPR), as will be described in detail below. The VBPR 1010 can be formed using similar conductive materials and analogous processing techniques as those used to form the metal contacts 1002. According to an embodiment, the VBPRs 1010 can be formed between neighboring first source/drain regions 902 (P2P space) and between neighboring second source/drain regions 904 (N2N space). More particularly, the VBPRs 1010 can be formed adjacent to, and electrically in contact with, at least one metal contact 1002, as shown in FIG. 7A. In the depicted embodiment, the VBPR 1010 extend all the way from a top surface of at least one metal contact 1002 to a top surface of the first sacrificial layer 104 (or a bottommost surface of the STI regions 310).

Figure 7D:
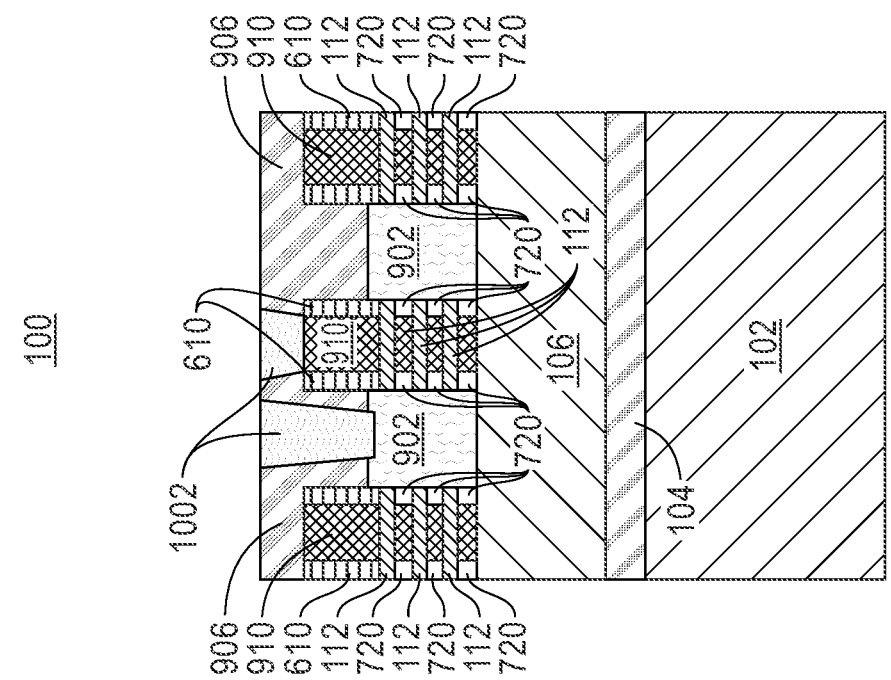
FIG. 7D is a cross-sectional view of the semiconductor structure taken along X-X, as depicted in FIG. 1, according to an alternate embodiment of the present disclosure.
Figure 7C:
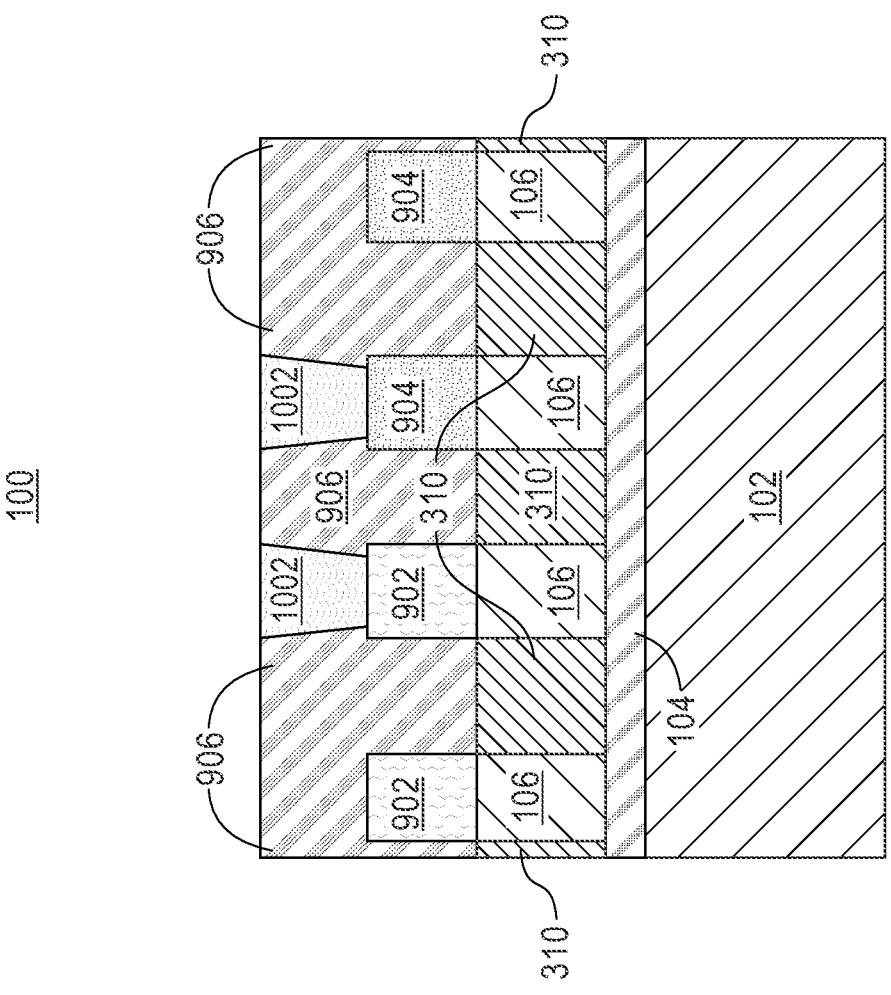
FIG. 7C is a cross-sectional view of the semiconductor structure taken along Y2-Y2, as depicted in FIG. 1, after middle-of-line contact patterning and metallization, according to an alternate embodiment of the present disclosure.

In some embodiments, only metal contacts 1002 are formed in the semiconductor structure 100 for electrically connecting front-end-of-line devices to subsequently formed device levels (e.g., back-end-of-line level), as depicted in FIGS. 7C-7D. As can be observed, in such embodiments, the VBPRs 1010 are not formed in the semiconductor structure 100.

Figure 8C:
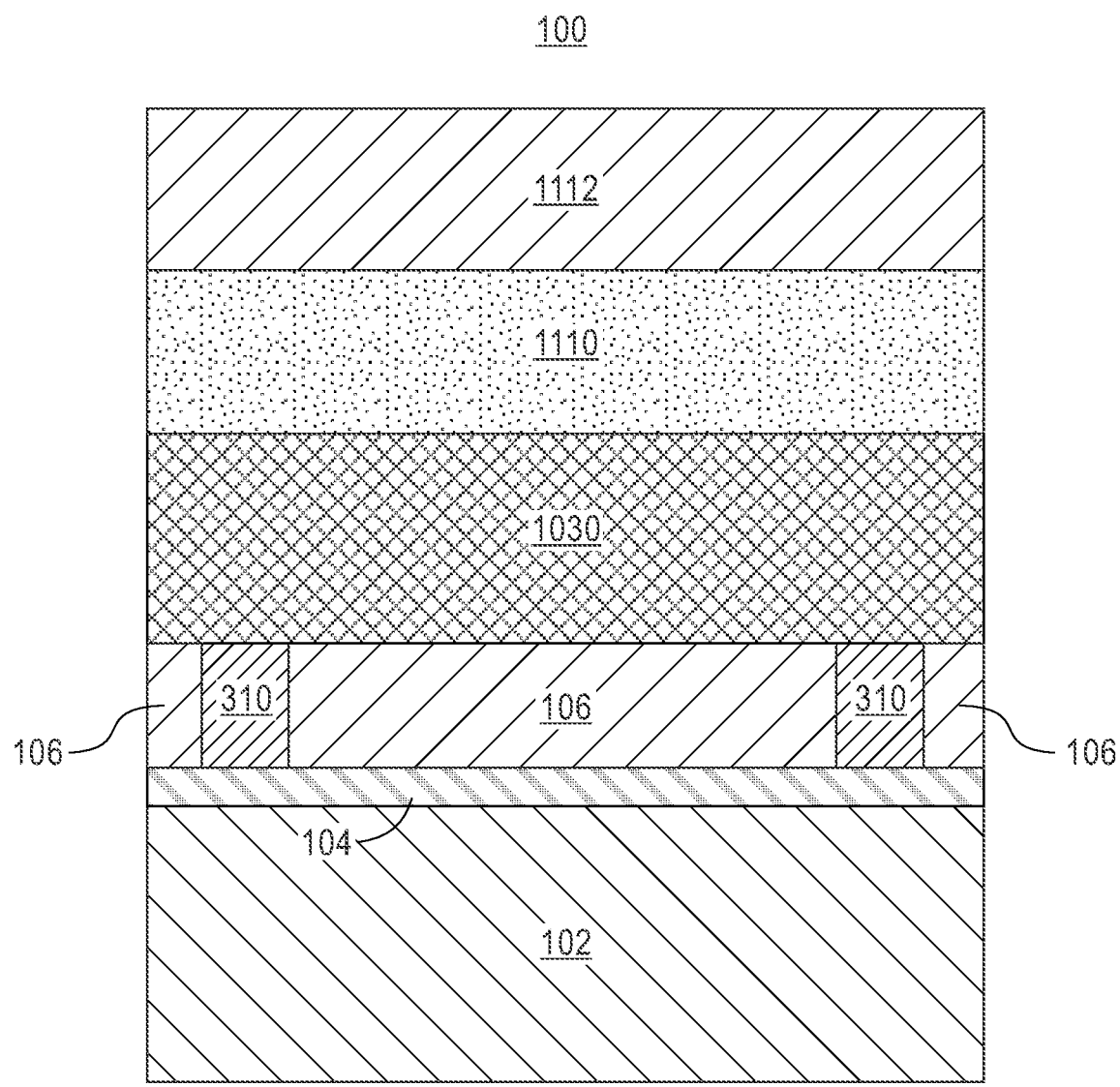
FIG. 8C is a cross-sectional view of the semiconductor structure taken along a passive device region, according to an embodiment of the present disclosure.

Referring now to FIGS. 8A-8C, cross-sectional views of the semiconductor structure 100 are shown after forming a back-end-of-line (BEOL) interconnect level 1110 and a carrier wafer 1112, according to an embodiment of the present disclosure. In this embodiment, FIG. 8A is a cross-sectional view of the semiconductor structure 100 taken along line Y2-Y2 as depicted in FIG. 1, while FIG. 8B is a cross-sectional view of the semiconductor structure 100 taken along line X-X as depicted in FIG. 1. It should be noted that, in this embodiment, FIG. 8C is a cross-sectional view of the semiconductor structure 100 taken along a passive device region 100B of the semiconductor structure 100, while the cross-sectional views shown in FIG. 8A and FIG. 8B are taking along a logic (or active) device region 100A.

In this embodiment, the BEOL interconnect level 1110 is formed above the FEOL device level 30 in the logic device region 100A and above passive devices 1030 in the passive device region 100B of the semiconductor structure 100. It should be noted that for ease of illustration, without intent of limitation, the passive devices 1030 are simplistically depicted in FIG. 8C. As may be understood, the passive devices 1030 may include a plurality of electrical components that do not require backside power supply. Non-limiting examples of passive devices 1030 in the passive device region 100B may include capacitors, resistors, and the like.

Although not depicted in the figures, the BEOL interconnect level 1110 typically includes contacts, insulating layers (dielectrics), metal levels, and bonding sites for chip-to-package connections, as may be known by those skilled in the art. As mentioned above, various steps in the manufacture of semiconductor devices and semiconductor-based ICs are well known and so, in the interest of brevity, many conventional steps will only be mentioned briefly herein or will be omitted entirely without providing the well-known process details.

According to an embodiment, after forming the BEOL interconnect level 1110, the semiconductor structure 100 (i.e., the semiconductor wafer) is bonded to the carrier wafer (or auxiliary substrate) 1112. The carrier wafer 1112 may act as a reinforcing substrate for providing mechanical strength during processing (e g., thinning) of the semiconductor wafer. The process of bonding the semiconductor wafer to the carrier wafer 1112 can be achieved by conventional wafer bonding process, such as dielectric-to-dielectric bonding or Cu-to-Cu bonding.

Accordingly, the carrier wafer 1112 may include silicon oxide layers or SiCN layers, or any other layers applicable in the direct bonding technology applied in state of the art packaging techniques. Bonding of the device wafer to the carrier wafer 1112 takes place by such known direct bonding techniques, thus obtaining the assembly shown in FIGS. 9A-9C after the wafer is flipped.

Figure 9C:
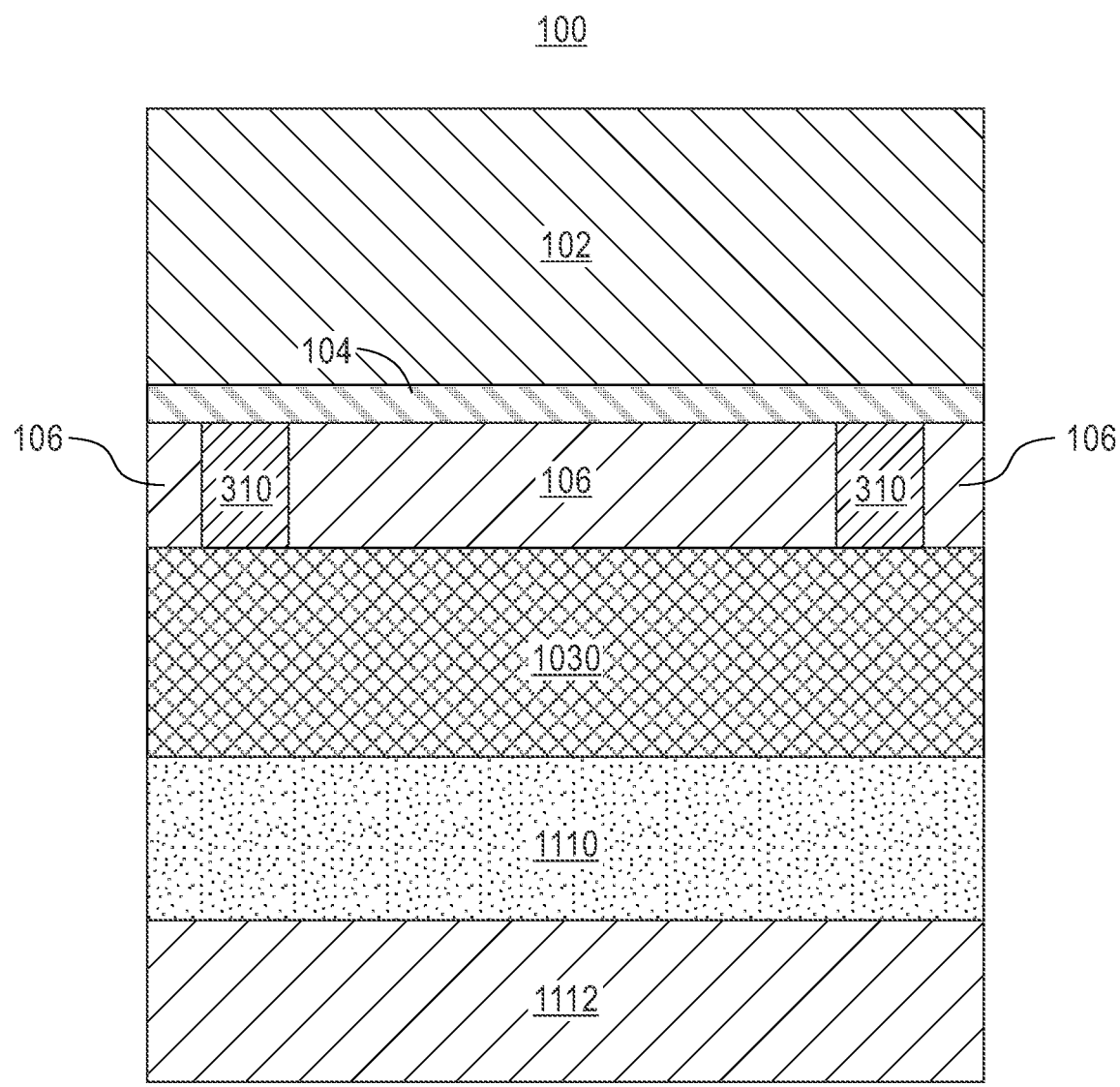
FIG. 9C is a cross-sectional view of the semiconductor structure taken along a passive device region, according to an embodiment of the present disclosure.
Figure 10C:
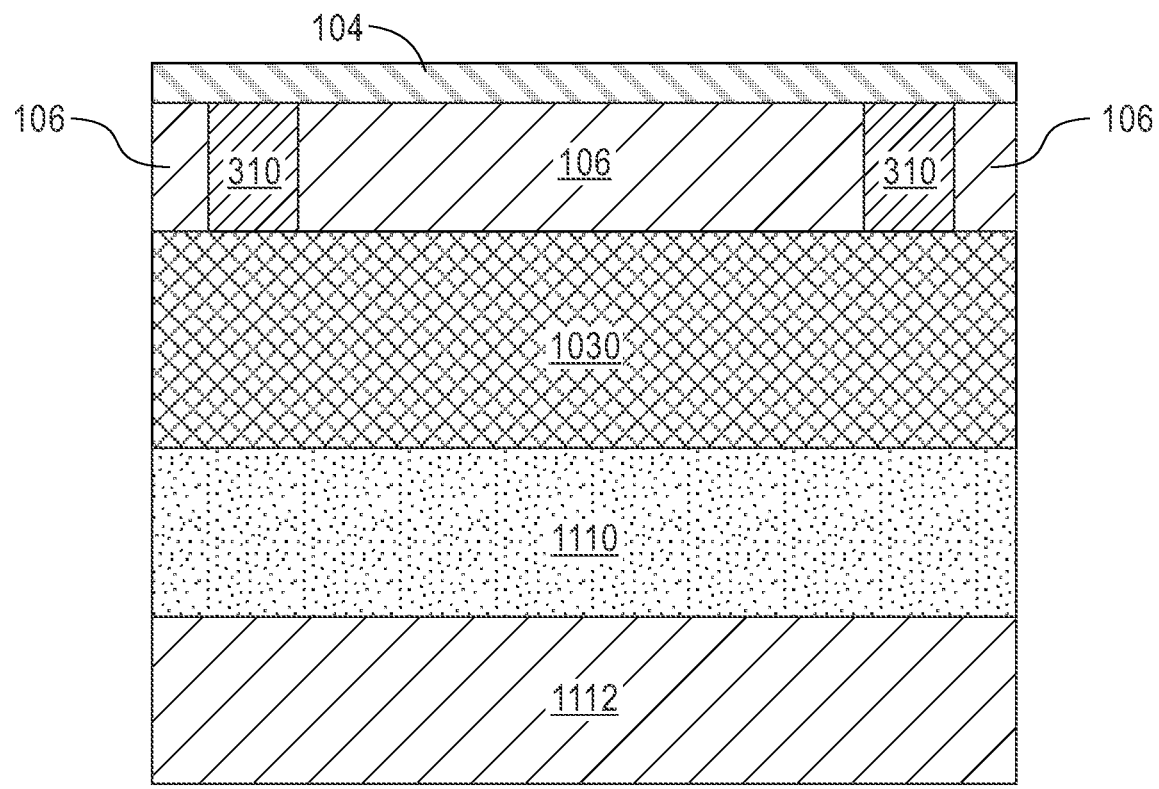
FIG. 10C is a cross-sectional view of the semiconductor structure taken along a passive device region, according to an embodiment of the present disclosure.

Referring now to FIGS. 9A-9C and FIGS. 10A-10C simultaneously, cross-sectional views of the semiconductor structure 100 are shown after wafer flipping and removal of the substrate 102, according to an embodiment of the present disclosure. In these embodiments, FIG. 9A and FIG. 10A are cross-sectional views of the semiconductor structure 100 taken along line Y2-Y2 as depicted in FIG. 1, while FIG. 9B and FIG. 10B are cross-sectional views of the semiconductor structure 100 taken along line X-X as depicted in FIG. 1. Further, in this embodiment, FIG. 9C and FIG. 10C are cross-sectional views of the semiconductor structure 100 taken along the passive device region 100B of the semiconductor structure 100, as explained above.

In the depicted embodiments, after the wafer is flipped, the substrate 102 is removed using regular grinding, CMP and selective etching processes including wet or dry etching techniques. According to an embodiment, the grinding process is conducted until substantially removing the substrate 102 from the semiconductor structure 100 and only a few microns of Si remains. After that, an optional CMP process can be further used to reduce the thickness variation, and finally a highly selective Si etching process is used to remove the remaining substrate 102 from the semiconductor structure 100. In the depicted embodiment, the first sacrificial layer 104 act as an etch stop during the highly selective Si removal process, preventing excessive Si etch which may damage the replacement gate 910 and first and second source/drain regions 902, 904.

Figures 11A, 11B:
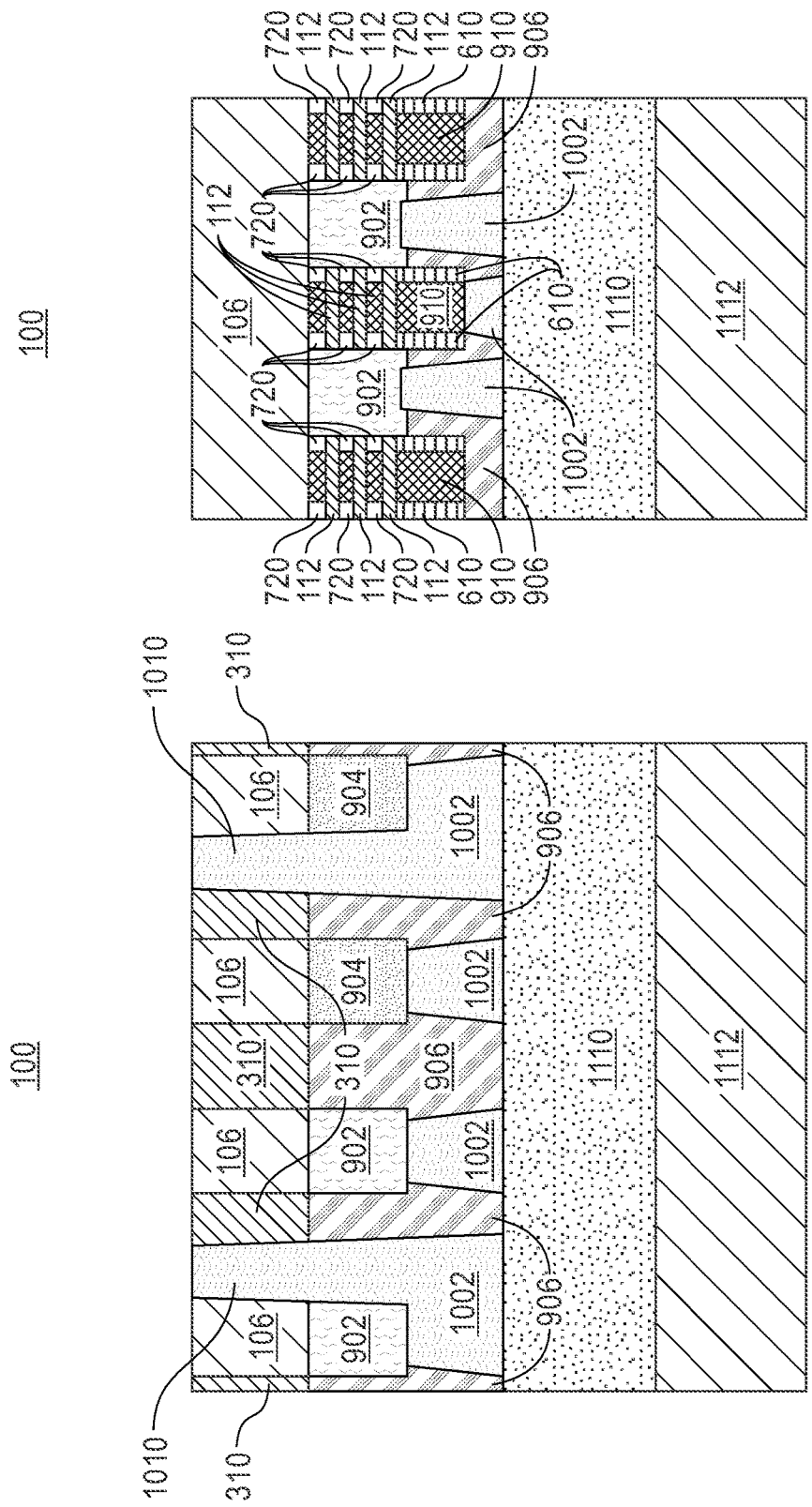
FIG. 11A is a cross-sectional view of the semiconductor structure taken along Y2-Y2, as depicted in FIG. 1, after forming a mask layer on the passive device region and removing a first sacrificial layer, according to an embodiment of the present disclosure.
FIG. 11B is a cross-sectional view of the semiconductor structure taken along X-X, as depicted in FIG. 1, according to an embodiment of the present disclosure.
Figure 11C:
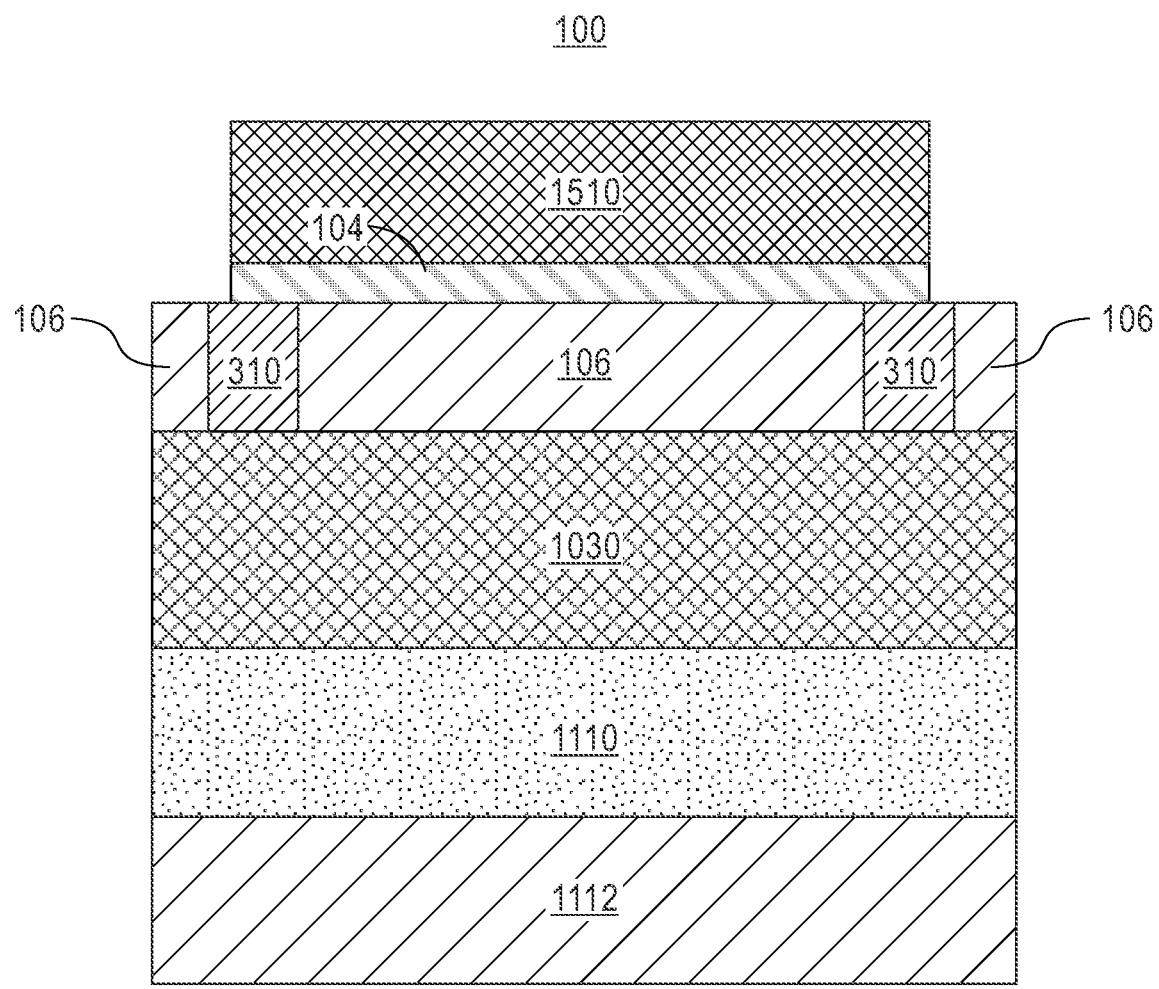
FIG. 11C is a cross-sectional view of the semiconductor structure taken along a passive device region, according to an embodiment of the present disclosure.
Figures 12A, 12B:
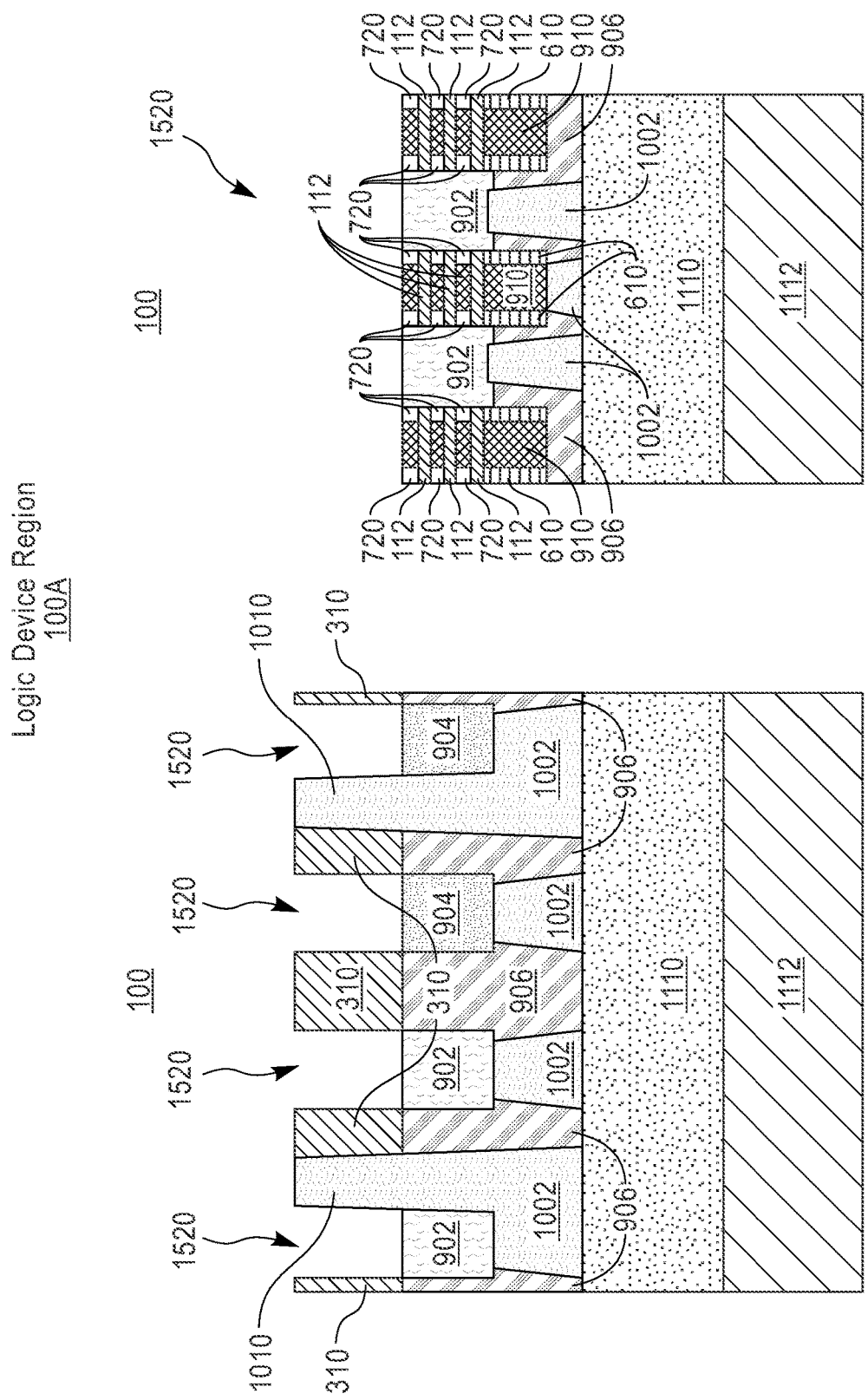
FIG. 12A is a cross-sectional view of the semiconductor structure taken along Y2-Y2, as depicted in FIG. 1, after removing remaining Si-containing areas, according to an embodiment of the present disclosure.
FIG. 12B is a cross-sectional view of the semiconductor structure taken along X-X, as depicted in FIG. 1, according to an embodiment of the present disclosure.
Figure 12C:
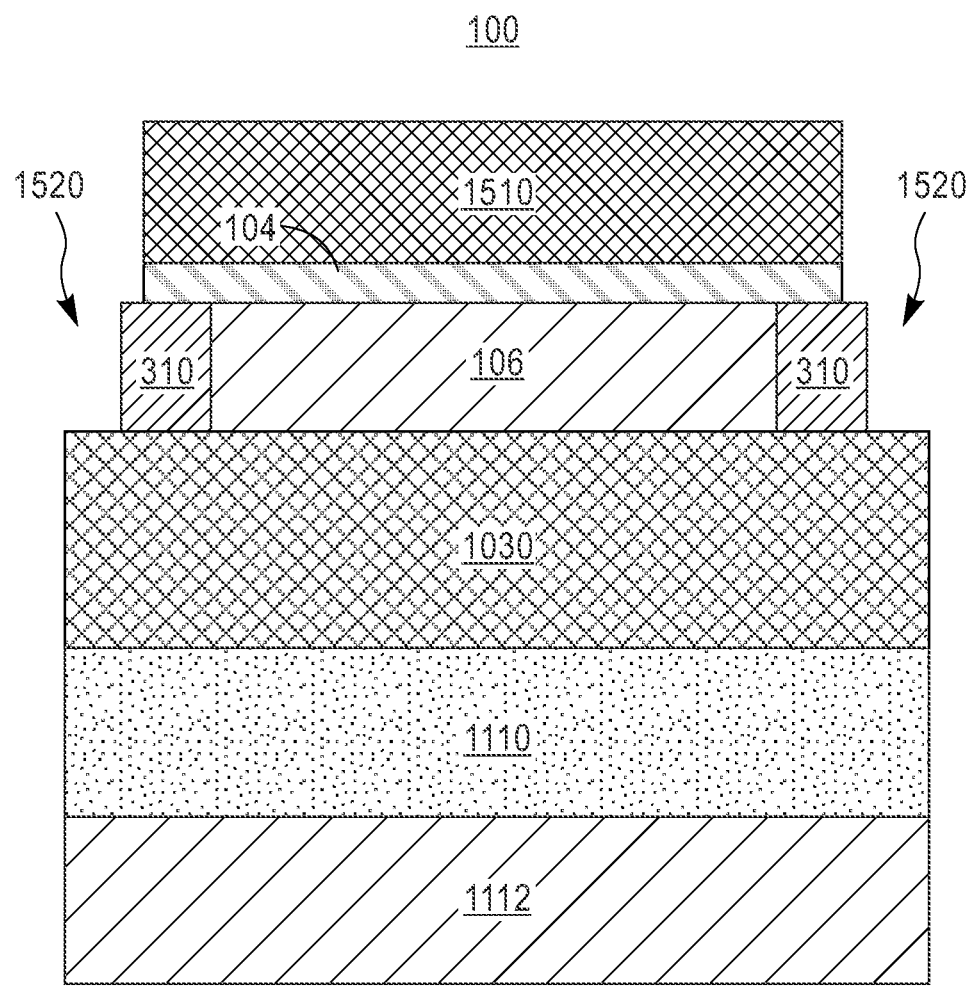
FIG. 12C is a cross-sectional view of the semiconductor structure taken along a passive device region, according to an embodiment of the present disclosure.
Figure 13B:
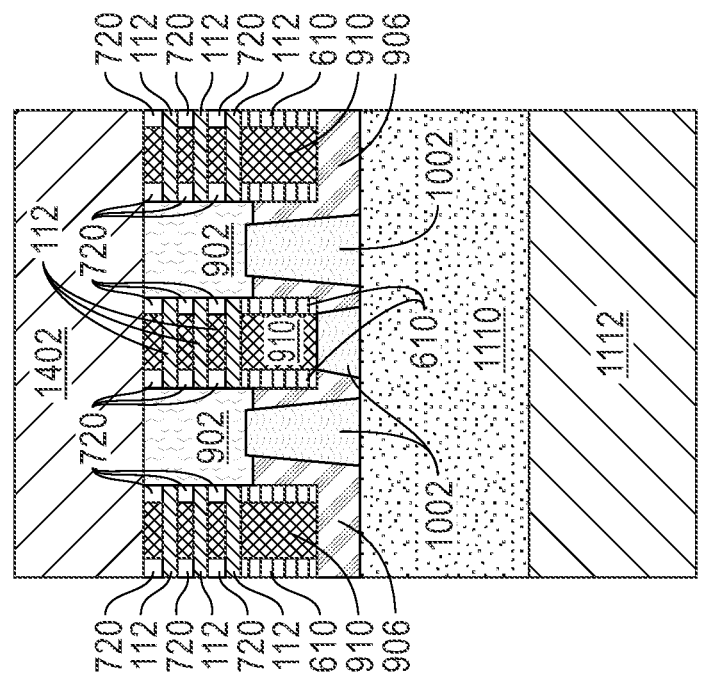
FIG. 13B is a cross-sectional view of the semiconductor structure taken along X-X, as depicted in FIG. 1, according to an embodiment of the present disclosure.
Figure 13A:
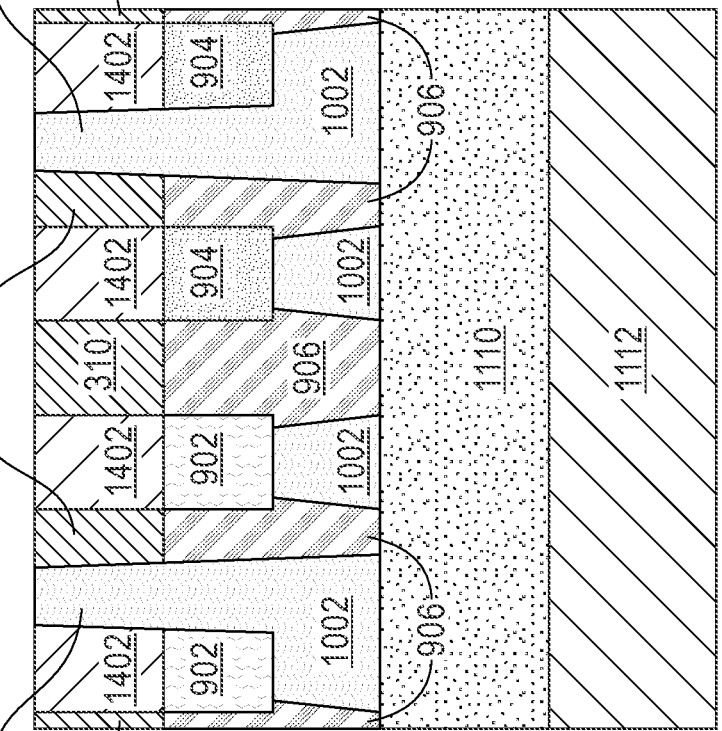
FIG. 13A is a cross-sectional view of the semiconductor structure taken along Y2-Y2, as depicted in FIG. 1, after forming a first backside interlayer dielectric, according to an embodiment of the present disclosure.
Figure 13C:
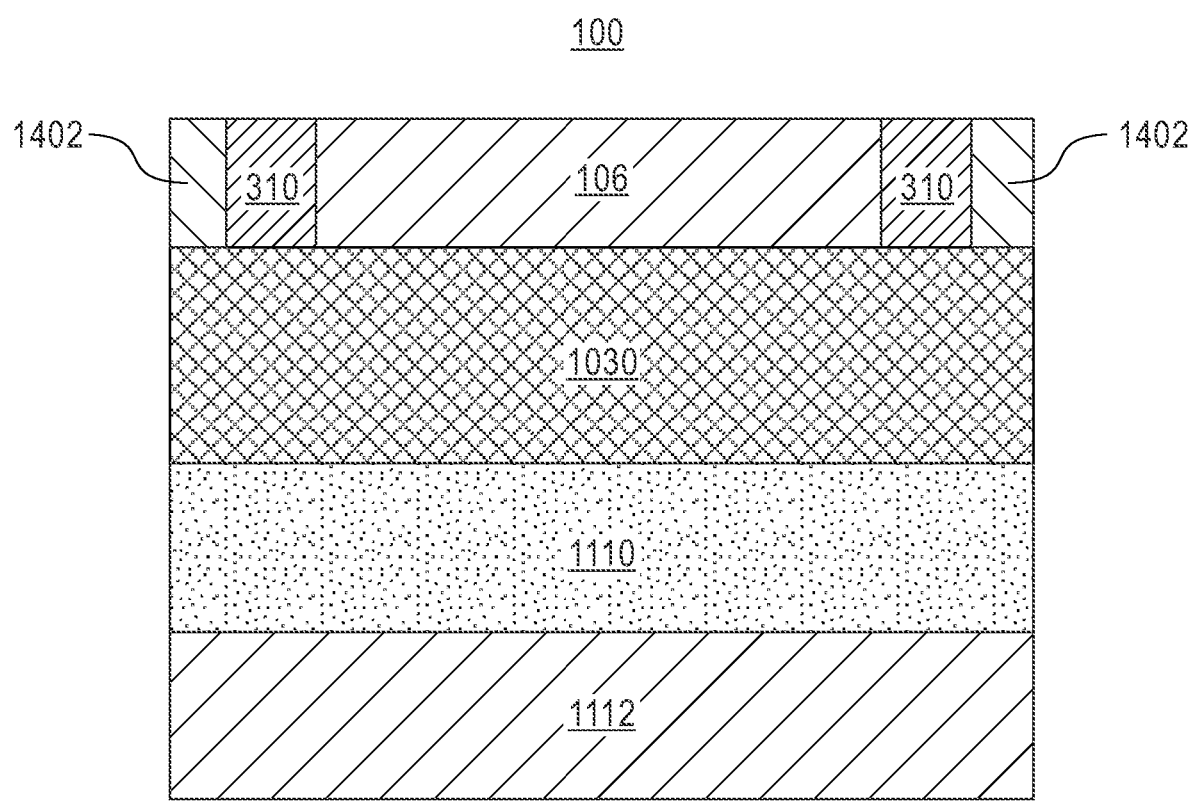
FIG. 13C is a cross-sectional view of the semiconductor structure taken along a passive device region, according to an embodiment of the present disclosure.

Referring now to FIGS. 11A-11C, FIGS. 12A-12C and FIGS. 13A-13C simultaneously, cross-sectional views of the semiconductor structure 100 are shown after forming a mask layer 1510 on the passive device region 100B, removing the first sacrificial layer 104 and remaining Si-containing areas, i.e., the first semiconductor layer 106, and forming a first backside interlayer dielectric (BILD) 1402, according to an embodiment of the present disclosure. In these embodiments, FIG. 11A, FIG. 12A and FIG. 13A are cross-sectional views of the semiconductor structure 100 taken along line Y2-Y2 as depicted in FIG. 1, while FIG. 11B, FIG. 12B and FIG. 13B are cross-sectional views of the semiconductor structure 100 taken along line X-X as depicted in FIG. 1. Further, in this embodiment, FIG. 11C, FIG. 12C and FIG. 13C are cross-sectional views of the semiconductor structure 100 taken along the passive device region 100B of the semiconductor structure 100, as explained above.

In the depicted embodiment, prior to removing the first sacrificial layer 104, a mask layer 1510 (such as an organic planarization layer (OPL)) can be formed on the passive device region 100B of the semiconductor structure 100, as shown in FIG. 11C by conventional lithography and etching process. The mask layer 1510 can be made of any organic planarizing material that is capable of effectively preventing damage of underlying layers during subsequent etching processes. The mask layer 1510 can include, but is not necessarily limited to, an organic polymer including C, H, and N. In an embodiment, the organic planarizing material can be free of silicon (Si). In another embodiment, the organic planarizing material can be free of Si and fluorine (F). As defined herein, a material is free of an atomic element when the level of the atomic element in the material is at or below a trace level detectable with analytic methods available in the art. Non-limiting examples of organic planarizing materials for forming the mask layer 1510 may include JSR HM8006, JSR HM8014, AZ UM10M2, Shin Etsu ODL 102, or other similar commercially available materials. The mask layer 1510 may be deposited by, for example, spin coating.

A lithography process followed by an etching process can be conducted on the semiconductor structure 100 for etching the mask layer 1510 as depicted in FIG. 11C. In some embodiments, etching the mask layer 1510 can be conducted by, for example, an OPL RIE including a trace point detection. In one or more embodiments, the mask layer 1510 may protect the passive device region 100B during subsequent removal of the first sacrificial layer 104 and first semiconductor layer 106 from the logic device region 100A and selected areas of the passive device region 100B, as depicted in FIGS. 12A-12C.

According to an embodiment, any suitable etching technique may be used to remove the first sacrificial layer 104 from the logic device region 100A. More particularly, any suitable etching technique can be conducted on the semiconductor structure 100 to remove the first sacrificial layer 104 from areas of the semiconductor structure 100 not covered by the mask layer 1510. In embodiments in which the first sacrificial layer 104 is made of SiGe a hot SCl or dry HCl etch can be used to remove the first sacrificial layer 104. In embodiments in which the first sacrificial layer 104 is made of $SiO_2$, DHF wet clean can be used to remove the first sacrificial layer 104.

After removing the first sacrificial layer 104, a process similar to the one described in FIGS. 10A-10C for removing the substrate 102 can be conducted to remove the first semiconductor layer 106 from the logic device region 100A and from areas of the passive device region 100B not covered by the mask layer 1510. As depicted in FIGS. 12A-12C, removal of the first semiconductor layer 106 from the logic device region 100A and passive device region 100B form first openings 1520 in the semiconductor structure 100. The first openings 1520 may expose a top surface of the first and second source/drain regions 902, 904 in the logic device region 100A and outer portions of the passive devices 1030 in the logic device region 100B. It should be noted that the first openings 1520 may also expose a top surface and a sidewall of the VBPR 1010 opposing the STI regions 310 (as shown in FIG. 12A) and a top surface of the replacement gate 910 (as shown in FIG. 12B). At this point of the manufacturing process, any suitable etching technique (e.g., ashing) can be employed to remove the mask layer 1510.

With reference now to FIGS. 13A-13C, the first BILD 1402 may be subsequently formed within the first openings 1520 using standard methods and materials, such as those used to form the interlevel dielectric layer 906. In an exemplary embodiment, a thickness of the first BILD 1402 may vary between approximately 40 nm to approximately 300 nm, and ranges therebetween. In one or more embodiments, a planarization process (e.g., CMP) can be conducted on the semiconductor structure 100 after forming the first BILD 1402.

It should be noted that, during the planarization process conducted on the first BILD 1402, the remaining portion of the first sacrificial layer 104 (FIG. 12C) is removed from the passive device region 100B of the semiconductor structure 100. It should also be noted that, after removing the mask layer 1510 and first sacrificial layer 104 from the passive device region 100B, a portion of the first semiconductor layer 106 (previously protected by the mask layer 1510) remains on the backside of the semiconductor structure 100, as shown in FIG. 13C. This remaining portion of the first semiconductor layer 106 (i.e., a Si-containing layer) may allow the formation of one or more field effect transistor devices on the backside of the semiconductor structure 100.

Figures 14A, 14B:
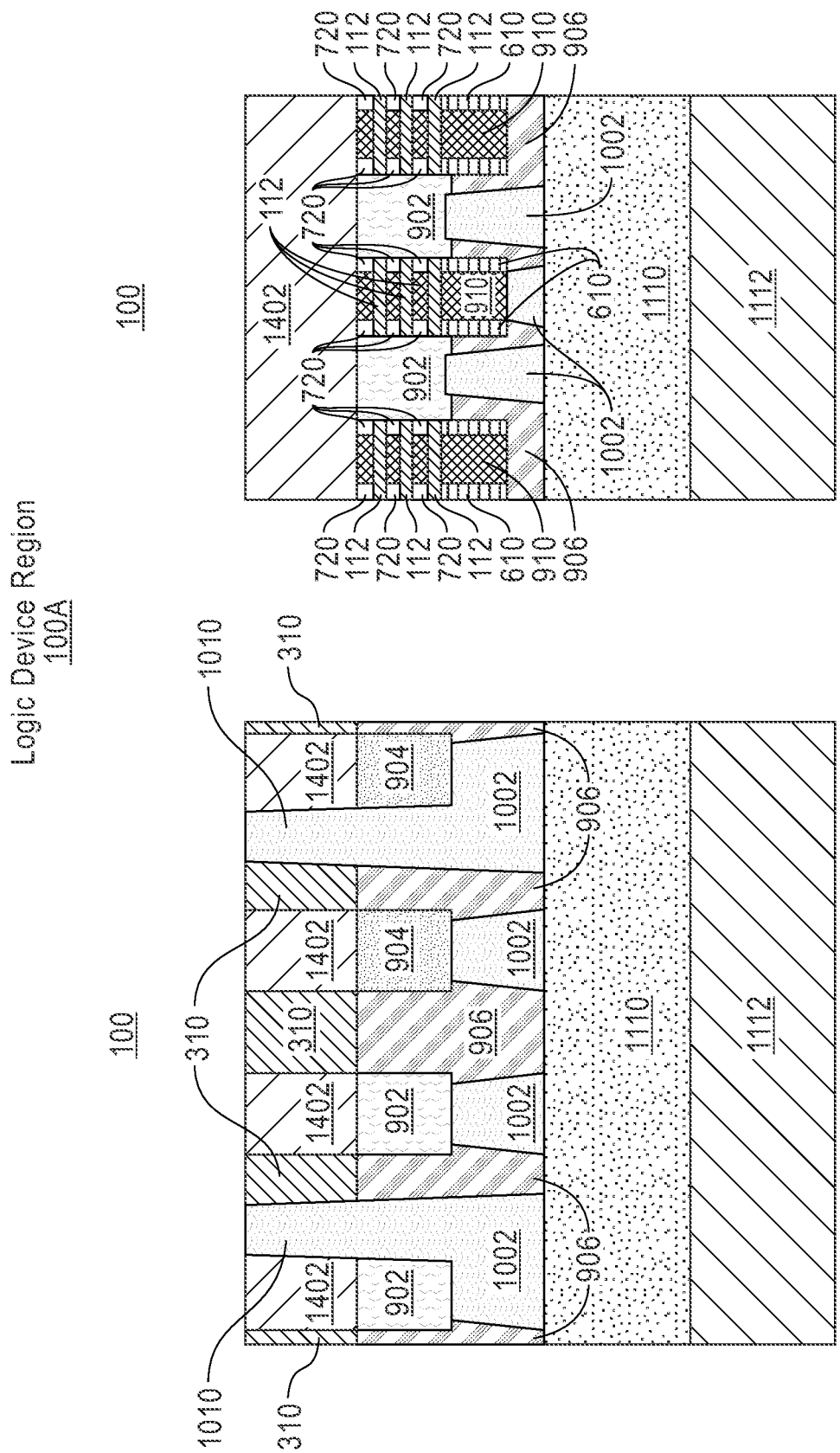
FIG. 14A is a cross-sectional view of the semiconductor structure taken along Y2-Y2, as depicted in FIG. 1, after forming a backside transistor device, according to an embodiment of the present disclosure.
FIG. 14B is a cross-sectional view of the semiconductor structure taken along X-X, as depicted in FIG. 1, according to an embodiment of the present disclosure.
Figure 14C:
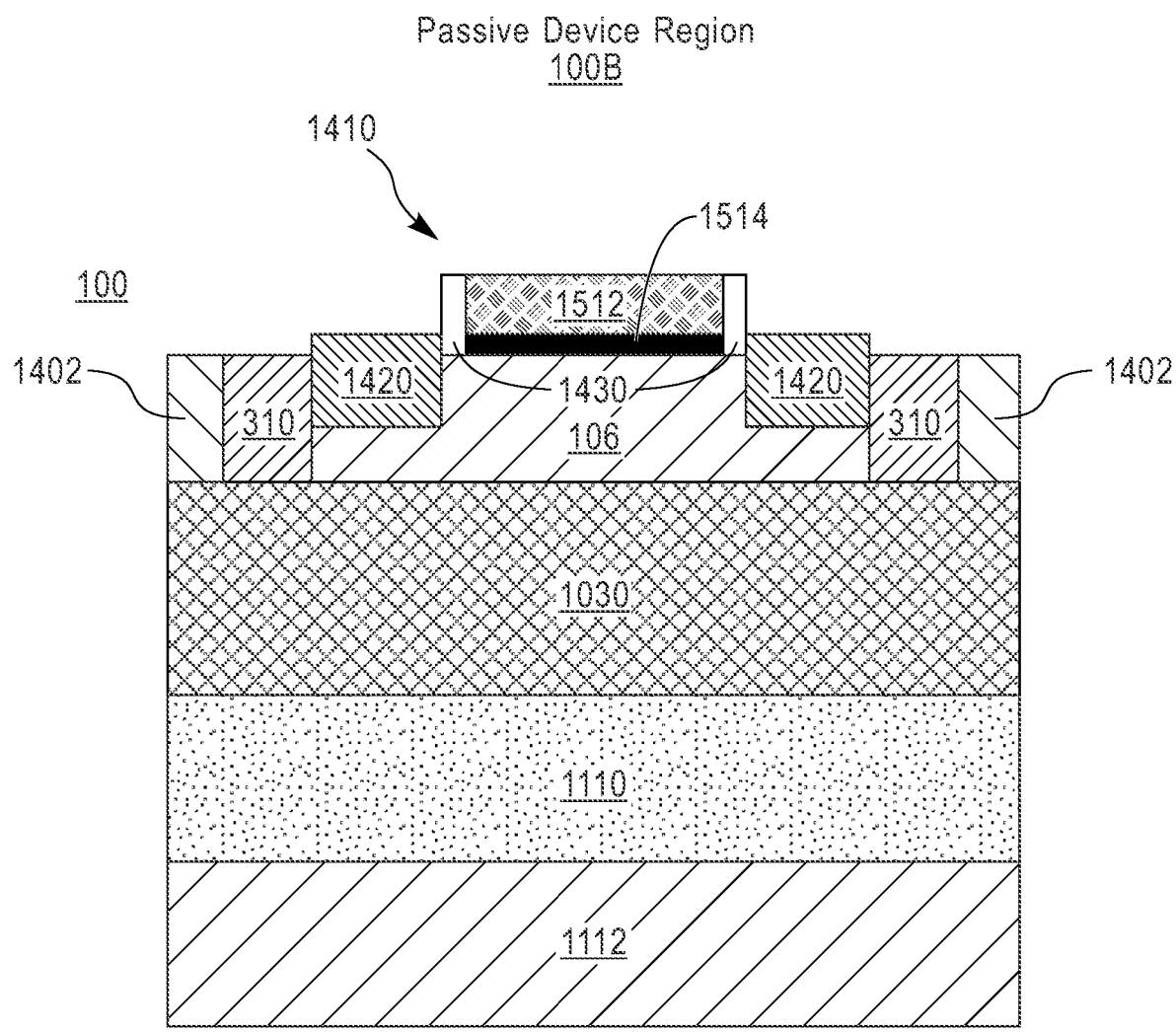
FIG. 14C is a cross-sectional view of the semiconductor structure taken along a passive device region, according to an embodiment of the present disclosure.

Referring now to FIGS. 14A-14C, cross-sectional views of the semiconductor structure 100 are shown after forming a backside transistor device 1410, according to an embodiment of the present disclosure. In this embodiment, FIG. 14A is a cross-sectional view of the semiconductor structure 100 taken along line Y2-Y2 as depicted in FIG. 1, while FIG. 14B is a cross-sectional view of the semiconductor structure 100 taken along line X-X as depicted in FIG. 1. It should be noted that, in this embodiment, FIG. 14C is a cross-sectional view of the semiconductor structure 100 taken along the passive device region 100B of the semiconductor structure 100, while the cross-sectional views shown in FIG. 14A and FIG. 14B are taking along the logic device region 100A.

Known semiconductor fabrication operations have been used to form the backside transistor device 1410 as depicted in FIG. 14C. Thus, conventional techniques related to semiconductor device and integrated circuit (IC) fabrication will not be described in detail herein to avoid unnecessarily obscuring the presented embodiments. As shown in FIG. 14C, the backside transistor device 1410 includes backside source/drain regions 1420 adjacent to a backside metal gate 1512. The backside metal gate 1512 is disposed above a gate dielectric 1514 with backside sidewall spacers 1430 disposed along opposite sidewalls of the backside metal gate 1512 and gate dielectric 1514.

In some embodiments, an initial thickness of the first semiconductor layer 106 may be substantially larger than the one described above with reference to FIG. 2 (i.e., starting wafer). For example, in such embodiments, the initial thickness of the first semiconductor layer 106 may vary between approximately 100 nm to approximately 300 nm. A thicker first semiconductor layer 106 may allow the formation of raised backside source/drain regions 1420 (not depicted in the figures) for the backside transistor device 1410.

Figure 15C:
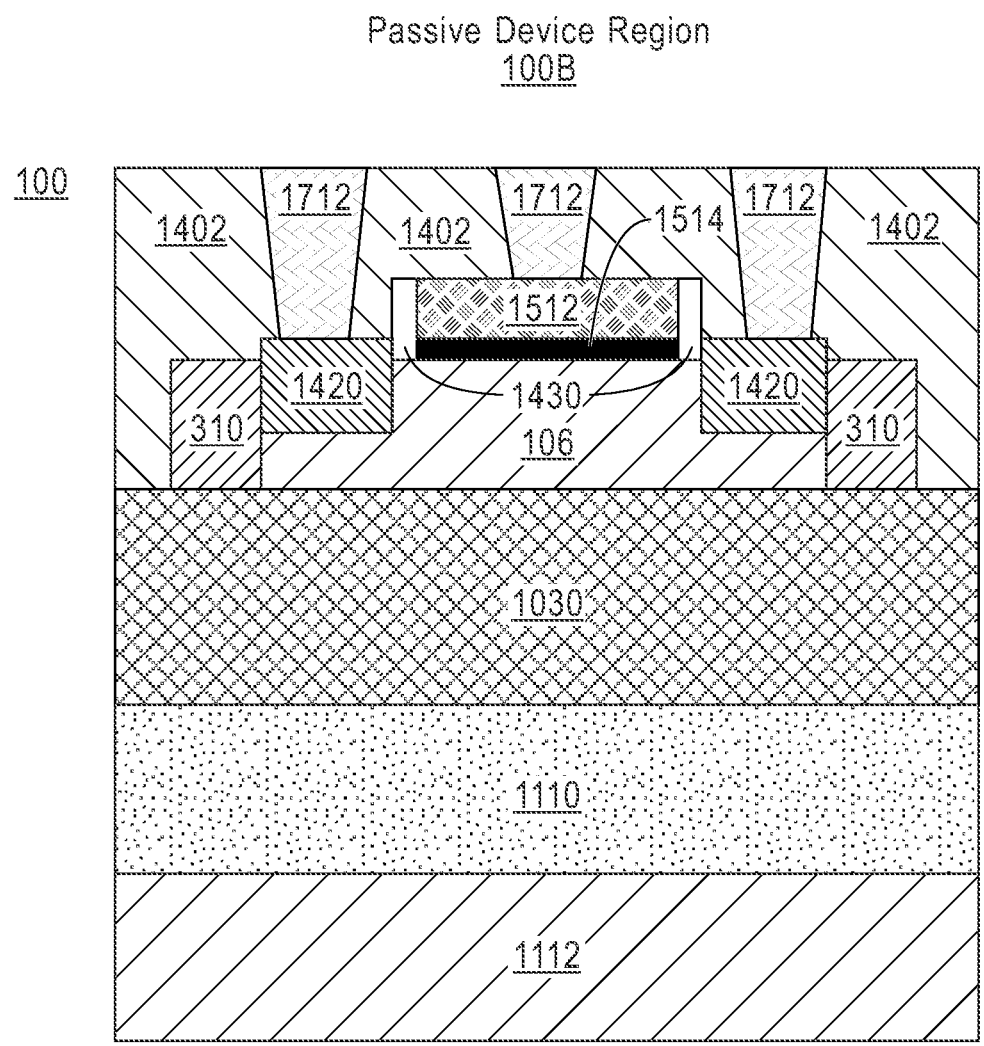
FIG. 15C is a cross-sectional view of the semiconductor structure taken along a passive device region, according to an embodiment of the present disclosure.

Referring now to FIGS. 15A-15C, cross-sectional views of the semiconductor structure 100 are shown after forming backside power rails (BPRs) 1710 and backside metal contacts 1712, according to an embodiment of the present disclosure. In this embodiment, FIG. 15A is a cross-sectional view of the semiconductor structure 100 taken along line Y2-Y2 as depicted in FIG. 1, while FIG. 15B is a cross-sectional view of the semiconductor structure 100 taken along line X-X as depicted in FIG. 1. It should be noted that, in this embodiment, FIG. 15C is a cross-sectional view of the semiconductor structure 100 taken along the passive device region 100B of the semiconductor structure 100, while the cross-sectional views shown in FIG. 15A and FIG. 15B are taking along the logic device region 100A.

In this embodiment, the BPRs 1710 and backside metal contacts 1712 are formed within a second backside ILD layer formed in analogous ways and composed of similar materials as the first BILD 1402. Thus, for ease of illustration, this second backside ILD layer will be continued to be referred as first BILD 1402.

With continued reference to FIGS. 15A-15C, the process of forming the BPRs 1710 includes patterning a backside power rail trench (not shown) in the first BILD 1402, for example, by conventional lithography and reactive ion etching. In the depicted example, the backside power rail trench (not shown) is etched until reaching an uppermost surface of the VBPR 1010, as shown in FIG. 15A. In some embodiments, the aspect ratio of the backside power rail trench (not shown) may be about 0.5 to 5.0.

To form the BPRs 1710 in the logic device region 100A of the semiconductor structure 100, the backside power rail trenches (not shown) can be filled with a conductive metal. The choice of metallization for backside power rails is based on where in the integration flow the rail is formed and metalized. In the depicted embodiment, the BPRs 1710 are formed in the backside of the semiconductor structure 100. In such instances the BPRs 1710 may be formed by depositing, for example, a layer of ruthenium (Ru) or Cu. In other embodiments, the conductive metal forming the BPRs 1710 may include Co, W, Al, and the like. According to an embodiment, the BPRs 1710 are electrically connected to one or more (source/drain) metal contacts 1002 through the VBPR 1010 for supplying power to the devices (e.g., field effect transistors) in the FEOL level 30 (FIGS. 8A-8C).

More particularly, in PFET architectures, the BPRs 1710 may include a VDD rail embedded in a PFET region of the semiconductor structure 100, while in NFET architectures, the BPRs 1710 may include a VSS rail embedded in the NFET region of the semiconductor structure 100. Thus, in the depicted embodiment, a BPR 1710 (VSS rail) is electrically connected to a first source/drain region 902 through the VBPR 1010 (located between adjacent first source/drain regions 902) and at least one (source/drain) metal contact 1002. Similarly, a BPR 1710 (VDD rail) is electrically connected to a second source/drain region 904 through the VBPR 1010 (located between adjacent second source/drain regions 904) and at least another (source/drain) metal contact 1002.

With continued reference to FIGS. 15A-15C, the backside metal contacts 1712 can be formed in the passive device region 100B of the semiconductor structure 100 using well-known techniques. For example, the backside metal contact 1712 can be formed using processing steps similarly to those used to form the metal contacts 1002, described above with reference to FIGS. 7A-7B. In some embodiments, the backside metal contacts 1712 and BPRs 1710 can be metallized at the same time, and can include the same metals, similar to those forming the metal contacts 1002.

It should be noted that in the semiconductor structure 100, the backside transistor device 1410 is formed at substantially the same level of the BPRs 1710. More particularly, in the proposed embodiments, a top surface of the backside transistor device 1410 is located at the same level of a region located between a bottom surface of the BPRs 1710 and a top surface of the BPRs 1710.

Figure 16C:
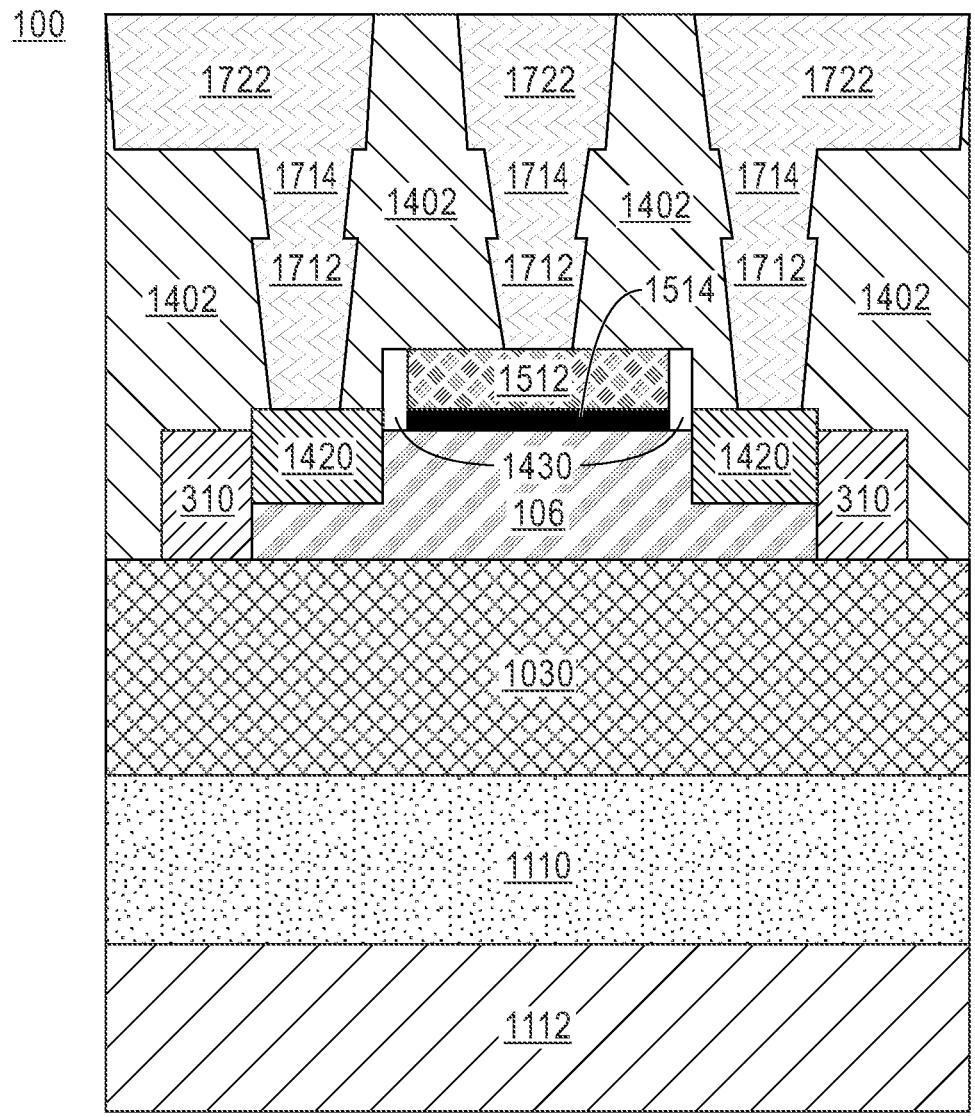
FIG. 16C is a cross-sectional view of the semiconductor structure taken along a passive device region, according to an embodiment of the present disclosure.

Referring now to FIGS. 16A-16C, cross-sectional views of the semiconductor structure 100 are shown after forming a backside power delivery network (PDN) 1720 and backside interconnects 1722, according to an embodiment of the present disclosure. In this embodiment, FIG. 16A is a cross-sectional view of the semiconductor structure 100 taken along line Y2-Y2 as depicted in FIG. 1, while FIG. 16B is a cross-sectional view of the semiconductor structure 100 taken along line X-X as depicted in FIG. 1. It should be noted that, in this embodiment, FIG. 16C is a cross-sectional view of the semiconductor structure 100 taken along the passive device region 100B of the semiconductor structure 100, while the cross-sectional views shown in FIG. 16A and FIG. 16B are taking along the logic device region 100A.

In this embodiment, the PDN 1720 and backside interconnects 1722 are formed within a third backside ILD layer formed in analogous ways and composed of similar materials as the first BILD 1402. Thus, for ease of illustration, this third backside ILD layer will be continued to be referred as first BILD 1402.

The structure of the PDN 1720 can be made according to known techniques. Depending on the exact function of the transistor arrangement, a number of the first and second source/drain regions 902, 904 may be connected to backside power and ground via the VBPR 1010. As mentioned above, the VBPR 1010 is a metal area placed between first source/drain regions 902 (N2N space) and between second source/drain regions 904 (P2P space), i.e., between source/drain regions of similar polarity. As depicted in FIG. 16A, the VBPR 1010 is in contact with a bottom surface of the BPRs 1710, and embedded within an intermediate STI region 310 (located between same polarity regions) and the interlevel dielectric layer 906 (known as the pre-metal dielectric, i.e., this is the layer known in the art on top of which the BEOL layers are built).

In passive device region, remaining Si substrate is kept, to facilitate backside transistor formation over single crystal Si.

It should be noted that the BEOL interconnect level 1110 in the semiconductor structure 100 manufactured according to the disclosed technology is separated from the PDN 1720, thereby increasing the routing resources in the semiconductor structure 100 for signal wirings in the BEOL level.

Similarly to the PDN 1720, backside interconnects 1722 can be made according to known techniques. As known by those skilled in the art, according to the function of the transistor arrangement, substrate vias or simply vias 1714 can be formed in the first BILD 1402 to electrically connect PDN 1720 to one or more BPRs 1710 and to electrically connect one or more of the backside metal contacts 1712 to the backside interconnects 1722. It should be noted that the process of forming the vias 1714 is standard and well-known in the art.

Figure 17C:
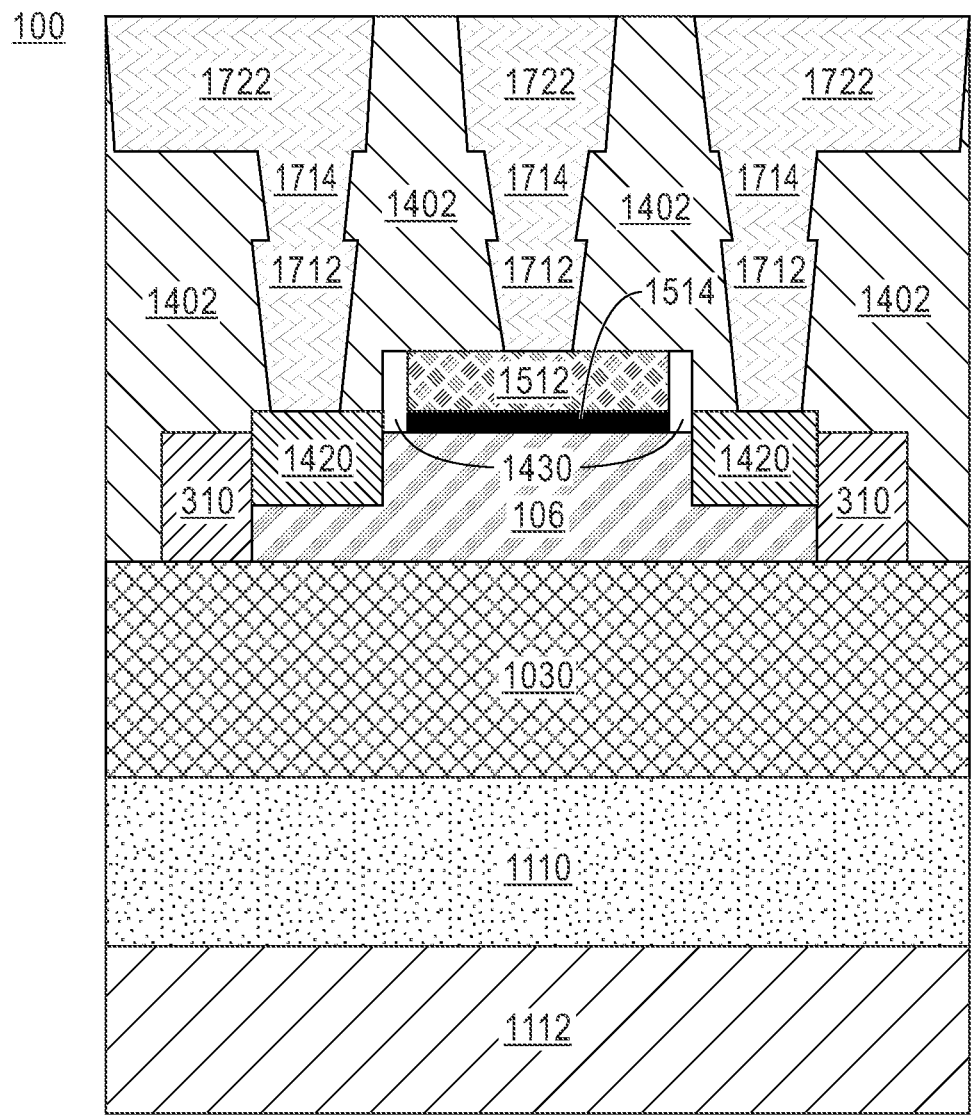
FIG. 17C is a cross-sectional view of the semiconductor structure taken along a passive device region, according to an alternate embodiment of the present disclosure.

In the embodiments described above with reference to FIGS. 7C-7D in which the VBPRs 1010 are not formed in the semiconductor structure 100, backside metal contacts 1820 to first source/drain regions 902 and second source/drain regions 904 can be formed within the first BILD 1402 for electrically connecting FEOL devices to the BPRs 1710, as depicted in FIGS. 17A-17C. Thus, instead of using the VBPR 1010 to connect the first and second source/drain regions 902, 904 to the BPRs 1710, in this alternate embodiment, direct backside contact (BSCA) is used to wire the first and second source/drain regions 902, 904 to the BPRs 1710.

In all instances, all remaining Si substrate is removed from the logic device region 100A to eliminate the need for forming dielectric spacers to isolate VBPRs or BSCAs from the remaining Si substrate, thereby facilitating VBPR or BSCA formation. The remaining Si substrate is kept in the passive device region 100B to facilitate backside transistor formation over single-crystal Si.

Accordingly, the previously described embodiments provide a method of forming a semiconductor structure having a backside transistor integrated with a backside power delivery network that can improve device scaling. The method includes forming a front-end-of-line level including a plurality of field effect transistors electrically connected to a back-end-of-line interconnect level, the back-end-of-line interconnect level are located on a first side of the front-end-of-line level, forming a backside power rail embedded within a backside interlayer dielectric located on a second side of the front-end-of-line level opposing the first side of the front-end-of-line level, forming a via-to-backside power rail (or a backside metal contact) embedded, at least in part, within the backside interlayer dielectric, the via-to-backside power rail being adjacent and electrically connected to at least one source/drain metal contact and extending from the at least one source/drain metal contact to a first surface of the backside power rail, and forming at least one backside field effect transistor on a first semiconductor layer disposed, at least in part, above a passive device region, a first side of the passive device region being in contact with the first semiconductor layer and a second side of the passive device region, opposing the first side, being in contact with the back-end-of-line interconnect level.

According to an embodiment, the at least one backside field effect transistor is at the same level as the backside power rail, and each of the plurality of field effect transistors includes a source/drain region in which a first sidewall of the source/drain region is in contact with an interlevel dielectric layer and a second sidewall of the source/drain region, opposing the first sidewall, is in contact with the via-to-backside power rail.

According to an embodiment, the method further includes forming a plurality of shallow trench isolation regions located between adjacent field effect transistors, the via-to-backside power rail being adjacent to at least one shallow trench isolation region located between two field effect transistors of similar polarity.

According to an embodiment, forming the at least one backside field effect transistor further includes depositing a mask layer above a portion of the first semiconductor layer located on the passive device region, selectively removing the first semiconductor layer from an active region including the plurality of field effect transistors and from areas of the passive device region not covered by the mask layer, and removing the mask layer to expose an uppermost surface of the first semiconductor layer, the first semiconductor layer including a single-crystal silicon layer. The passive device region of the semiconductor structure including a plurality of electrical components not requiring backside power supply (e.g., capacitors and resistors).

According to an embodiment, forming the at least one backside field effect transistor further includes forming a backside source/drain region on opposite sides of a metal gate structure disposed above a gate dielectric, and forming backside sidewalls spacers disposed along the metal gate structure and the gate dielectric.

According to an embodiment, the method further includes forming a power delivery network electrically connected to the backside power rail through a substrate via embedded within the backside interlayer dielectric and forming a plurality of backside metal contacts electrically connecting the at least one backside field effect transistor to a plurality of interconnect structures through the substrate via.

According to an embodiment, the method further includes forming a carrier wafer in contact with a second surface of the back-end-of-line interconnect level opposing a first surface of the back-end-of-line interconnect level.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a front-end-of-line level including a plurality of field effect transistors electrically connected to a back-end-of-line interconnect level, the back-end-of-line interconnect level being located on a first side of the front-end-of-line level;
a backside power rail embedded within a backside interlayer dielectric located on a second side of the front-end-of-line level opposing the first side of the front-end-of-line level, the backside power rail being electrically connected to at least one field effect transistor of the plurality of field effect transistors; and
at least one backside field effect transistor on a first semiconductor layer disposed, at least in part, above a passive device region, a first side of the passive device region being in contact with the first semiconductor layer and a second side of the passive device region, opposing the first side, being in contact with the back-end-of-line interconnect level.

2. The semiconductor structure of claim 1, further comprising:
a via-to-backside power rail embedded, at least in part, within the backside interlayer dielectric, the via-to-backside power rail being adjacent and electrically connected to at least one source/drain metal contact and extending from the at least one source/drain metal contact to a first surface of the backside power rail.

3. The semiconductor structure of claim 2, wherein each of the plurality of field effect transistors comprises a source/drain region, a first sidewall of the source/drain region being in contact with an interlevel dielectric layer and a second sidewall of the source/drain region, opposing the first sidewall, being in contact with the via-to-backside power rail.

4. The semiconductor structure of claim 3, wherein the backside power rail is electrically connected to the at least one field effect transistor through a backside metal contact electrically connected to the source/drain region.

5. The semiconductor structure of claim 2, further comprising:
a plurality of shallow trench isolation regions located between adjacent field effect transistors, the via-to-backside power rail being adjacent to at least one shallow trench isolation region located between two field effect transistors of similar polarity.

6. The semiconductor structure of claim 1, wherein the at least one backside field effect transistor is at the same level as the backside power rail.

7. The semiconductor structure of claim 1, wherein the first semiconductor layer disposed, at least in part, above the passive device region comprises a single-crystal silicon layer.

8. The semiconductor structure of claim 1, wherein the at least one backside field effect transistor further comprises:
a backside source/drain region on opposite sides of a gate structure disposed above a gate dielectric; and
backside sidewalls spacers disposed along the gate structure and the gate dielectric.

9. The semiconductor structure of claim 1, further comprising:
a power delivery network electrically connected to the backside power rail through a substrate via embedded within the backside interlayer dielectric.

10. The semiconductor structure of claim 9, further comprising:
a plurality of backside metal contacts electrically connecting the at least one backside field effect transistor to a plurality of interconnect structures through the substrate via.

11. The semiconductor structure of claim 1, further comprising:
a carrier wafer in contact with a second surface of the back-end-of-line interconnect level opposing a first surface of the back-end-of-line interconnect level.

12. The semiconductor structure of claim 1, wherein the passive device region comprises a plurality of electrical components not requiring backside power supply, including at least one of capacitors and resistors.

13. A method of forming a semiconductor structure, comprising:
forming a front-end-of-line level including a plurality of field effect transistors electrically connected to a backend-of-line interconnect level, the back-end-of-line interconnect level being located on a first side of the front-end-of-line level;

forming a backside power rail embedded within a backside interlayer dielectric located on a second side of the front-end-of-line level opposing the first side of the front-end-of-line level, the backside power rail being electrically connected to at least one field effect transistor of the plurality of field effect transistors; and forming at least one backside field effect transistor on a first semiconductor layer disposed, at least in part, above a passive device region, a first side of the passive device region being in contact with the first semiconductor layer and a second side of the passive device region, opposing the first side, being in contact with the back-end-of-line interconnect level.

14. The method of claim 13, further comprising:
forming a via-to-backside power rail embedded, at least in part, within the backside interlayer dielectric, the via-to-backside power rail being adjacent and electrically connected to at least one source/drain metal contact and extending from the at least one source/drain metal contact to a first surface of the backside power rail.

15. The method of claim 14, wherein each of the plurality of field effect transistors comprises a source/drain region, a first sidewall of the source/drain region being in contact with an interlevel dielectric layer and a second sidewall of the source/drain region, opposing the first sidewall, being in contact with the via-to-backside power rail.

16. The method of claim 15, wherein the backside power rail is electrically connected to the at least one field effect transistor through a backside metal contact electrically connected to the source/drain region.

17. The method of claim 14, further comprising:
forming a plurality of shallow trench isolation regions located between adjacent field effect transistors, the via-to-backside power rail being adjacent to at least one shallow trench isolation region located between two field effect transistors of similar polarity.

18. The method of claim 13, wherein the at least one backside field effect transistor is at the same level as the backside power rail.

19. The method of claim 13, wherein forming the at least one backside field effect transistor further comprises:
depositing a mask layer above a portion of the first semiconductor layer located on the passive device region;
selectively removing the first semiconductor layer from an active region including the plurality of field effect transistors and from areas of the passive device region not covered by the mask layer; and
removing the mask layer to expose an uppermost surface of the first semiconductor layer, wherein the first semiconductor layer comprises a single-crystal silicon layer.

20. The method of claim 13, further comprising:
forming the at least one backside field effect transistor including a backside source/drain region on opposite sides of a gate structure disposed above a gate dielectric;
forming backside sidewalls spacers disposed along the gate structure and the gate dielectric;
forming a power delivery network electrically connected to the backside power rail through a substrate via embedded within the backside interlayer dielectric;
forming a plurality of backside metal contacts electrically connecting the at least one backside field effect transistor to a plurality of interconnect structures through the substrate via; and
forming a carrier wafer in contact with a second surface of the back-end-of-line interconnect level opposing a first surface of the back-end-of-line interconnect level.

* * * * *